United States Patent
Watabe et al.

(10) Patent No.: US 7,561,856 B2
(45) Date of Patent: Jul. 14, 2009

(54) DISTORTION COMPENSATION AMPLIFYING APPARATUS AND BASE STATION

(75) Inventors: Masayuki Watabe, Kawasaki (JP); Yasuhito Funyu, Kawasaki (JP); Hiroaki Abe, Kawasaki (JP); Hisato Kawano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 614 days.

(21) Appl. No.: 10/840,700

(22) Filed: May 6, 2004

(65) Prior Publication Data
US 2005/0164656 A1    Jul. 28, 2005

(30) Foreign Application Priority Data
Jan. 27, 2004 (JP) ............................. 2004-018447

(51) Int. Cl.
*H04B 1/04* (2006.01)

(52) U.S. Cl. ................. 455/114.3; 455/127.1; 455/103; 375/296

(58) Field of Classification Search ........... 455/91, 455/67.11, 127.1–127.4, 126, 103, 63.1, 455/69, 522; 375/141–142, 130, 295, 269
See application file for complete search history.

(56) References Cited

U.S. PATENT DOCUMENTS

| | | | | |
|---|---|---|---|---|
| 4,554,679 A | * | 11/1985 | Schiff ........................ 455/127.1 |
| 5,434,893 A | * | 7/1995 | Le Roy et al. ................. 455/91 |
| 5,734,967 A | * | 3/1998 | Kotzin et al. ................ 455/63.1 |
| 5,771,451 A | * | 6/1998 | Takai et al. .................. 455/522 |
| 5,930,301 A | * | 7/1999 | Chester et al. ............... 375/296 |
| 5,963,584 A | * | 10/1999 | Boulanger et al. ........... 375/141 |
| 6,154,652 A | * | 11/2000 | Park et al. .................... 455/126 |
| 6,195,529 B1 | * | 2/2001 | Linz et al. .................... 455/103 |
| 6,208,204 B1 | | 3/2001 | Suzuki et al. |
| 6,490,455 B1 | * | 12/2002 | Park et al. .................... 375/130 |
| 6,567,478 B2 | | 5/2003 | Oishi et al. |
| 6,611,565 B1 | * | 8/2003 | Bada et al. ................... 375/295 |
| 6,711,214 B1 | * | 3/2004 | Hershberger ................ 375/296 |
| 6,823,175 B1 | * | 11/2004 | Zayana et al. ............ 455/67.11 |
| 6,836,517 B2 | | 12/2004 | Nagatani et al. |
| 6,845,239 B1 | * | 1/2005 | Sato et al. ................ 455/67.11 |

(Continued)

FOREIGN PATENT DOCUMENTS

JP    9-69733    3/1997

(Continued)

OTHER PUBLICATIONS

European Search Report Dated Apr. 25, 2005.

(Continued)

*Primary Examiner*—Edward Urban
*Assistant Examiner*—Adeel Haroon
(74) *Attorney, Agent, or Firm*—Katten Muchin Rosenman LLP

(57) ABSTRACT

In a network employing code division multiplex access, a distortion compensation amplifying apparatus is provided which is capable of making quick response to carry out the distortion compensation with high accuracy even if the signal power to be inputted thereto varies rapidly. In this distortion compensation amplifying apparatus, the renewal of a distortion compensation coefficient in a renewing unit is complemented on the basis of a result of amplification in an amplifier with respect to a signal code-division-multiplexed in a pseudo-signal multiplexing unit.

25 Claims, 11 Drawing Sheets

U.S. PATENT DOCUMENTS

| | | | |
|---|---|---|---|
| 6,907,085 | B2 | 6/2005 | Kubo et al. |
| 6,925,106 | B2 | 8/2005 | Horaguchi et al. |
| 6,928,272 | B2 | 8/2005 | Doi |
| 6,977,915 | B2 * | 12/2005 | Chen et al. ............... 455/522 |
| 7,012,969 | B2 | 3/2006 | Ode et al. |
| 7,023,897 | B2 * | 4/2006 | Kurihara ................ 375/130 |
| 7,099,366 | B2 * | 8/2006 | Umeno ................... 375/130 |
| 7,154,914 | B1 * | 12/2006 | Pechner et al. ........... 370/516 |
| 2001/0007435 | A1 * | 7/2001 | Ode et al. ................ 455/69 |
| 2001/0051504 | A1 | 12/2001 | Kubo et al. |
| 2003/0035494 | A1 | 2/2003 | Bauder et al. |
| 2004/0066772 | A1 * | 4/2004 | Moon et al. ............ 455/127.2 |
| 2005/0226346 | A1 | 10/2005 | Ode et al. |

FOREIGN PATENT DOCUMENTS

| | | |
|---|---|---|
| JP | 9-102759 | 4/1997 |
| JP | 2000-278055 | 10/2000 |
| JP | 2001189685 | 7/2001 |
| JP | 2001251148 | 9/2001 |
| JP | 2001-345718 | 12/2001 |
| JP | 2002232325 | 8/2002 |
| JP | 2003168931 | 6/2003 |
| JP | 2003-338775 | 11/2003 |
| WO | WO 200011805 A1 * | 3/2000 |
| WO | 0108319 | 2/2001 |
| WO | WO 02/17586 | 2/2002 |

OTHER PUBLICATIONS

Toskala A. et al. WCDMA for UMTS, 2001 pp. 74-84 XP002318661.

Notice of Rejection dated Apr. 21, 2009, for the corresponding Japanese Application 2004-018447.

Notification of Reasons for Rejection mailed Feb. 3, 2009, from the corresponding Japanese Application.

\* cited by examiner

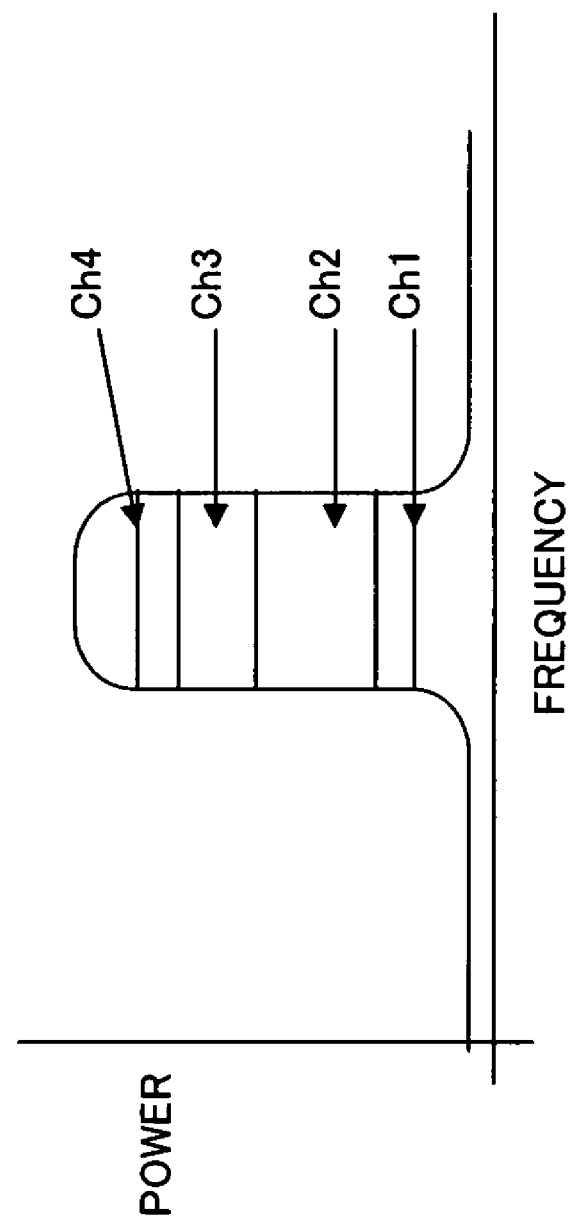

DISTORTION COMPENSATION AMPLIFYING APPARATUS AND BASE STATION

BACKGROUND OF THE INVENTION

1) Field of the Invention

The present invention relates to a transmitting apparatus on a communication network, preferably, to a transmitting apparatus on a radio communication network, and more particularly to a distortion compensation amplifying apparatus suitable for use in a transmitting unit constituting a base station, and it relates to a base station suitable for use in a radio network.

2) Description of the Related Art

FIG. 9 is a block diagram showing a transmitting apparatus in a base station which employs CDMA communications including a conventional digital pre-distortion compensation amplifying apparatus (digital pre-distortion AMP). In FIG. 9, a digital pre-distortion compensating amplifier 115 is connected to an antenna 116 to serve as a transmitting apparatus 117 to carry out radio transmissions of signals through the antenna 116.

This distortion compensation amplifier 115, shown in FIG. 9, is for use in a transmitting unit of a base station on a radio communication network, which interchanges signals with terminals according to the code division multiplex technique, and signals to the respective terminals are spectrum-spread in a spreading unit (not shown) and added so that a base band signal (which will be referred to hereinafter as a "BB signal") undergoing the code division multiplex processing is inputted thereto.

In this configuration, although distortion occurs in a power amplifier 106, a signal is previously distorted to a non-linear distortion in the power amplifier 106 through the use of units 102 to 105 and 107 to 113 so that the distortion is canceled to accomplish the distortion compensation.

In this case, although it is desirable to attain a linear output characteristic with respect to an input the non-linear distortion causes a non-linear output characteristic. Due to the non-linear distortion, in particular the input becomes below a desired gain in a high-level output region, or the phase of an output signal rotates although it is desirable to provide an output signal in a state where the phase does not rotate with respect to an input signal. The distortion characteristic signifies this non-linear distortion characteristic.

A detailed description will be given hereinbelow of the configuration of the distortion compensating amplifier 115 shown in FIG. 9. The distortion compensating amplifier 115 is made up of a complex multiplier 102, a modulator (MOD) 103, a digital/analog converter (D/A) 104, a frequency converter (CONV) 105, a power amplifier (PA) 106, a directional coupler 107, an analog/digital converter (A/D) 108, a demodulator (DEM) 109, a delay unit (DL) 110, a subtracter 111, an address producing unit 112 and a lookup table (LUT) 113.

In addition, in the distortion compensating amplifier 115 shown in FIG. 9, a BB signal from a spreading unit is inputted to the main-signal-system complex multiplier 102 and further to a reference-signal-system address producing unit 112 and the delay unit 110. In the LUT 113, distortion compensation coefficients are accumulated to compensate for the distortion characteristic of the power amplifier 106 in accordance with the power of the inputted BB signal, and in the address producing unit 112, an address corresponding to the value of power of the BB signal is obtained so that a distortion compensation coefficient corresponding to the obtained address is outputted to the complex multiplier 102.

That is, the BB signal inputted to the complex multiplier 102 is outputted in a state complex-multiplied by the distortion compensation coefficient from the LUT 113. Following this, it undergoes the phase modulation processing in the modulator 103, the conversion processing from the digital signal into an analog signal in the digital/analog converter 104 and the conversion processing into a radio frequency signal in the frequency converter 105. After these processing, the signal is amplified in the power amplifier 106 and then transmitted as a transmitted signal through the antenna 116. The non-linear distortion characteristic in the power amplifier 106 is compensated through the use of the distortion compensation coefficient from the LUT 113 which is complex-multiplied with respect to the BB signal.

Moreover, it is known that the non-linear distortion characteristic in the power amplifier 106 varies according to the environment such as the temperature around the location thereof, and in the distortion compensating amplifier 115 shown in FIG. 9, for carrying out the distortion compensation corresponding to this environment variation, a signal outputted from the power amplifier 106 is feedbacked to update the distortion compensation coefficient stored in the LUT 113.

Concretely, a portion of the signal amplified in the power amplifier 106 is inputted through the directional coupler 107 to the frequency converter 115 to be converted from a radio frequency into a signal in the original baseband frequency band, and it is converted into a digital signal in the analog/digital converter 108 and demodulated in the demodulator 109. Moreover, in the subtracter 111, the demodulated signal undergoes the subtraction processing using a corresponding signal from the delay unit 110. Through the use of the output of this subtracter 111, there are detected only the non-linear distortion components of the actual input signal and output signal in the power amplifier 106. That is, in the LUT 113, the distortion compensation coefficient is renewable through the use of the distortion component from the subtracter 111. In other words, the renewal of the distortion compensation coefficient is made to suppress the distortion component to be detected.

As conventional techniques related to the present invention, there are the techniques disclosed in Japanese Patent Laid-Open Nos. HEI 9-69733 and HEI 9-102759.

Japanese Patent Laid-Open No. HEI 9-69733 discloses a distortion compensating amplifier including a means whereby a distortion compensation coefficient for the compensation for a distortion characteristic component is produced on the basis of an error signal between an input signal and an output signal to/from the amplifier according to an adaptable algorithm.

Japanese Patent Laid-Open No. HEI 9-102759 discloses a technique which employs a non-linear compensating method whereby a signal for the compensation of a non-linear characteristic of an amplifier is read out from a random access memory (RAM) and amplified after added to a modulated input signal in advance and which carries out the control so that, in a transmitter having a non-linear compensating circuit made to demodulate a portion of an amplifier output so that the RAM contents are renewed to become equal to the modulated signal, an output of a training signal generating circuit is connected to an input of the transmitter during an inactive period and the amplifier output is connected to a terminating circuit to make the renewal of the RAM contents through the use of the training signal.

However, in the case of the distortion compensating amplifier 115 shown in FIG. 9 and the technique disclosed in Japanese Patent Laid-Open No. HEI 9-69733, the distortion compensation is made through the control for reducing the difference between a transmitted signal and a feedback signal to the utmost, and with respect to the distortion compensation coefficient needed for the distortion compensation, the initial value is stored through the training according to a pattern (rating) determined in a factory under limited time, which makes it difficult to finely store the distortion compensation coefficient according to the input level.

Accordingly, for example, as indicated by a time point A in FIG. 10, in a case in which a signal remote temporarily from the rating during the operation and insufficient (high) in training is suddenly inputted to the power amplifier, difficulty is encountered in outputting an appropriate distortion compensation coefficient immediately and, because of the renewal of the table based on the distortion, it takes time until the distortion compensation coefficient reaches the convergence, so the degradation of the distortion characteristic occurs in the meantime.

In particular, for example, when many calls (connections between base station and terminal) occurs transiently during the operation on a radio network, the power increases rapidly and this further enhances the necessity to shorten the convergence time of the table for keeping the communication quality.

FIG. 11 is an illustration for explaining the addition of the signal power of each channel by the code division multiplex. In the case of the code division multiplexing, a plurality of channel signals are multiplexed in the same frequency band and, hence, as shown in FIG. 11, the respective channel signal powers are added to each other. Therefore, since the number of occupied channels increases as the call quantity increases, the signal power also rises. Moreover, irrespective of the degree of call quantity, if the information quantity communicated increases, the signal power rises accordingly.

In addition, taking into consideration the influence of a variation of the distortion characteristic stemming from aged deterioration of the power amplifier and temperature variation, although, when the call quantity is large at all times, the error quantity becomes small because a table has been produced to store distortion compensation coefficients in high-output conditions, in the normal actual operation in which the frequency of occurrence of a high output is relatively low, the error of the distortion compensation coefficient stored in the table become relatively large.

On the other hand, although it can be considered that tables are finely produced according to the magnitude (small, intermediate, large) of signal level at the training to shorten the table convergence, the test time in the factory becomes longer, which leads to an increase in cost.

Moreover, in the case of the technique disclosed in Japanese Patent Laid-Open No. HEI 9-102759, since a training signal can be transmitted only during the transmission downtime, for a communication network such as the code division multiplex access in which there is basically no need for the transmission downtime and the communications are made in a state where difficulty is encountered in securing such a time period, if the transmission power increases rapidly, difficulty is experienced in quickly achieving the table convergence, which makes it difficult to maintain the communication quality.

SUMMARY OF THE INVENTION

The present invention has been developed with a view to eliminating these problems, and it is therefore an object of the invention to provide, in a code division multiplex access network, a distortion compensation amplifying apparatus and a base station, capable of carrying out the distortion compensation on an amplifier with high accuracy through quick response even if inputted signal power varies rapidly.

For this purpose, in accordance with an aspect of the present invention, there is provided a distortion compensation amplifying apparatus comprising a code division multiplexing unit for carrying out code division multiplex processing with respect to a baseband signal allocated to a plurality of channels through the use of spread codes different among the plurality of channels, an amplifier for amplifying a signal code-division-multiplexed in the code division multiplexing unit, a distortion compensating circuit unit for compensating for a distortion characteristic stemming from the amplifier through the use of a distortion compensation coefficient stored corresponding to a characteristic of a signal from the code division multiplexing unit, and a renewing unit for renewing (updating) the distortion compensation coefficient to be used for the compensation for the distortion characteristic in the distortion compensating circuit unit on the basis of a result of amplification in the amplifier, with the code division multiplexing unit including a pseudo-signal multiplexing unit for carrying out the code division multiplex processing with respect to a pseudo signal along with the baseband signal so that the renewal of the distortion compensation coefficient in the renewing unit is complemented on the basis of a result of amplification in the amplifier with respect to a signal code-division-multiplexed in the pseudo-signal multiplexing unit.

In addition, it is also appropriate that the distortion compensation amplifying apparatus further comprises a pseudo-signal producing unit for producing the pseudo signal, and the pseudo-signal multiplexing unit carries out the code division multiplex processing with respect to the pseudo signal from the pseudo-signal producing unit along with the baseband signal through the use of a spread code corresponding to a non-used channel of the channels allocated for the baseband signal.

Still additionally, it is also possible that the renewing unit renews the distortion compensation coefficient on the basis of a result of amplification in the amplifier with respect to a signal code-division-multiplexed in the pseudo-signal multiplexing unit to follow a variation of a distortion characteristic according to a using mode of the amplifier.

In this case, preferably, the distortion compensation amplifying apparatus further comprises a control unit for controlling the code division multiplex processing on the pseudo signal in the pseudo-signal multiplexing unit.

Moreover, it is also appropriate that this control unit includes an implementation/stop control unit for controlling the implementation/stop of the code division multiplex processing on the pseudo signal in the pseudo-signal multiplexing unit.

Still moreover, it is also appropriate that this control unit includes a power control unit for controlling power of a signal code-division-multiplexed in the pseudo-signal multiplexing unit.

Yet moreover, it is also appropriate that the control unit includes a recognizing unit for recognizing a using situation of the channel allocated to the baseband signal and transmission power of a signal amplified in the amplifier and the control unit is configured in a manner that when the transmission power is below a threshold set in advance and a non-used channel exists, controls the code division multiplexing unit on the basis of a result of recognition in the recognizing unit so that this non-used channel is allocated to a pseudo signal from the pseudo signal producing unit.

Furthermore, in accordance with another aspect of the present invention, there is provided a base station comprising a transmitting unit for radio-transmitting a signal code-division-multiplexed to a terminal side and a receiving unit for receiving a signal from a terminal, wherein the transmitting unit includes a code division multiplexing unit for carrying out the code division multiplex processing with respect to a baseband signal allocated to a plurality of channels through the use of spread codes different among the plurality of channels, an amplifier for amplifying a signal code-division-multiplexed in the code division multiplexing unit, a radio transmitting unit for radio-transmitting a signal amplified in the amplifier, a distortion compensating circuit unit for compensating for a distortion characteristic stemming from the amplifier through the use of a distortion compensation coefficient stored corresponding to a characteristic of a signal from the code division multiplexing unit, and a renewing unit for renewing the distortion compensation coefficient to be used for the compensation for the distortion characteristic in the distortion compensating circuit unit on the basis of a result of amplification in the amplifier, with the code division multiplexing unit including a pseudo-signal multiplexing unit for carrying out the code division multiplex processing with respect to a pseudo signal along with the baseband signal so that the renewal of the distortion compensation coefficient in the renewing unit is complemented on the basis of a result of amplification in the amplifier with respect to a signal code-division-multiplexed in the pseudo-signal multiplexing unit.

Still furthermore, it is also appropriate that the base station further comprises a pseudo-signal producing unit for producing the pseudo signal, and the pseudo-signal multiplexing unit carries out the code division multiplex processing with respect to the pseudo signal from the pseudo-signal producing unit along with the baseband signal through the use of a spread code corresponding to a non-used channel of the channels allocated for the baseband signal.

Yet furthermore, it is also possible that the renewing unit renews the distortion compensation coefficient on the basis of a result of amplification in the amplifier with respect to a signal code-division-multiplexed in the pseudo-signal multiplexing unit to follow a variation of a distortion characteristic according to a using mode of the amplifier.

In addition, the transmitting unit includes a control unit for controlling the code division multiplex processing on the pseudo signal in the pseudo-signal multiplexing unit.

Still additionally, it is also appropriate that the receiving unit is made to receive a signal from the terminal along with control channel information, and the control unit is made to calculate, on the basis of the control channel information received by the receiving unit, transmission power to be applied to a signal in an individual channel constituting the signal radio-transmitted from the transmitting unit and further to control, on the basis of a result of the calculation, the code division multiplex processing on the pseudo signal in the pseudo-signal multiplexing unit.

Yet additionally, it is also appropriate that the control unit receives call information on a radio network from a network control unit made to generalize the control of the radio network between the base station and a terminal and controls, on the basis of the received call information, the code division multiplex processing on the pseudo signal in the pseudo-signal multiplexing unit.

Moreover, it is also appropriate that the control unit monitors total power of a signal from the code division multiplexing unit and controls, on the basis of a result of the monitor, the code division multiplex processing on the pseudo signal in the pseudo signal multiplexing unit.

Still moreover, it is also appropriate that this control unit includes an implementation/stop control unit for controlling the implementation/stop of the code division multiplex processing on the pseudo signal in the pseudo-signal multiplexing unit.

Yet moreover, it is also appropriate that this control unit includes a power control unit for controlling power of a signal code-division-multiplexed in the pseudo-signal multiplexing unit.

Still moreover, it is also appropriate that the control unit includes a recognizing unit for recognizing a using situation of the channel allocated to the baseband signal and transmission power of a signal amplified in the amplifier and the control unit is configured in a manner that when the transmission power is below a threshold set in advance and a non-used channel exists, controls the code division multiplexing unit on the basis of a result of recognition in the recognizing unit so that this non-used channel is allocated to a pseudo signal from the pseudo signal producing unit.

In addition, in accordance with a further aspect of the present invention, there is provided a base station for use in a mobile communication system which employs a code division multiplex access method, the base station comprising an amplifier for amplifying a transmission signal to (addressed to) a mobile station, a storing unit for storing a distortion correction value corresponding to a level of the transmission signal and a pre-distortion compensation amplifying apparatus for acquiring the distortion correction value corresponding to the level of the transmission signal from the storing unit to carry out pre-distortion compensation processing on the transmission signal on the basis of the distortion correction value for suppressing the distortion stemming from the amplifier, with the distortion compensation amplifying apparatus including storage control means for putting the distortion correction value in the storing unit according to a distortion of the transmission signal after amplification and a pseudo-signal adding means for adding a pseudo signal to the transmission signal to the mobile station before the amplification.

In this case, preferably, the pseudo signal is not spread-processed with a spread code for separation from a transmission signal to another mobile station.

More preferably, the pseudo signal is added to the transmission signal to the mobile station after spread-processed through the use of one, or two or more, spread codes.

Moreover, it is also appropriate that the base station further comprises control means for controlling a level of the pseudo signal in accordance with a storing situation in the storing unit, or that it further comprises control means for increasing a level of the pseudo signal in a stepwise fashion.

More preferably, the pseudo signal is produced independently of a signal received as a transmission signal from a host device of the base station to the mobile station.

Thus, according to the present invention, since the renewal of the distortion compensation coefficient can be complemented in the renewing unit on the basis of a result of amplification in the amplifier with respect to a signal undergoing the code division multiplex processing in the pseudo-signal multiplexing unit, even if the signal power increases relatively fast and a signal with power out of rating is inputted to the amplifier, since the distortion compensation coefficient can be stored through the renewal processing in the renewing unit, a quick response becomes feasible to achieve the distortion compensation with high accuracy.

In addition, since a pseudo signal can properly be code-division-multiplexed during an operation of the apparatus owing to the employment of the control unit, with respect to off-rating regions, the renewing unit can update a region exposed to temperature variation or the like at the location and, hence, as the specification of the apparatus at the shipment from a factory, there is no need to store distortion compensation coefficients in an particularly high output region, which can minimize the memory capacity of the storing unit which is for storing the distortion compensation coefficients.

Still additionally, it is possible to narrow the signal power range in which the distortion compensation coefficients are to be stored as rating, which enables shortening a training time taken for setting storage values in the storing unit which stores distortion compensation coefficients before shipment of the apparatus.

BRIEF DESCRIPTION OF THE DRAWINGS

FIG. 11 is an illustration for describing the addition of each channel signal power by code division multiplexing.

DESCRIPTION OF THE PREFERRED EMBODIMENTS

Embodiments of the present invention will be described hereinbelow with reference to the drawings.

[A] Description of First Embodiment

Figure 1:
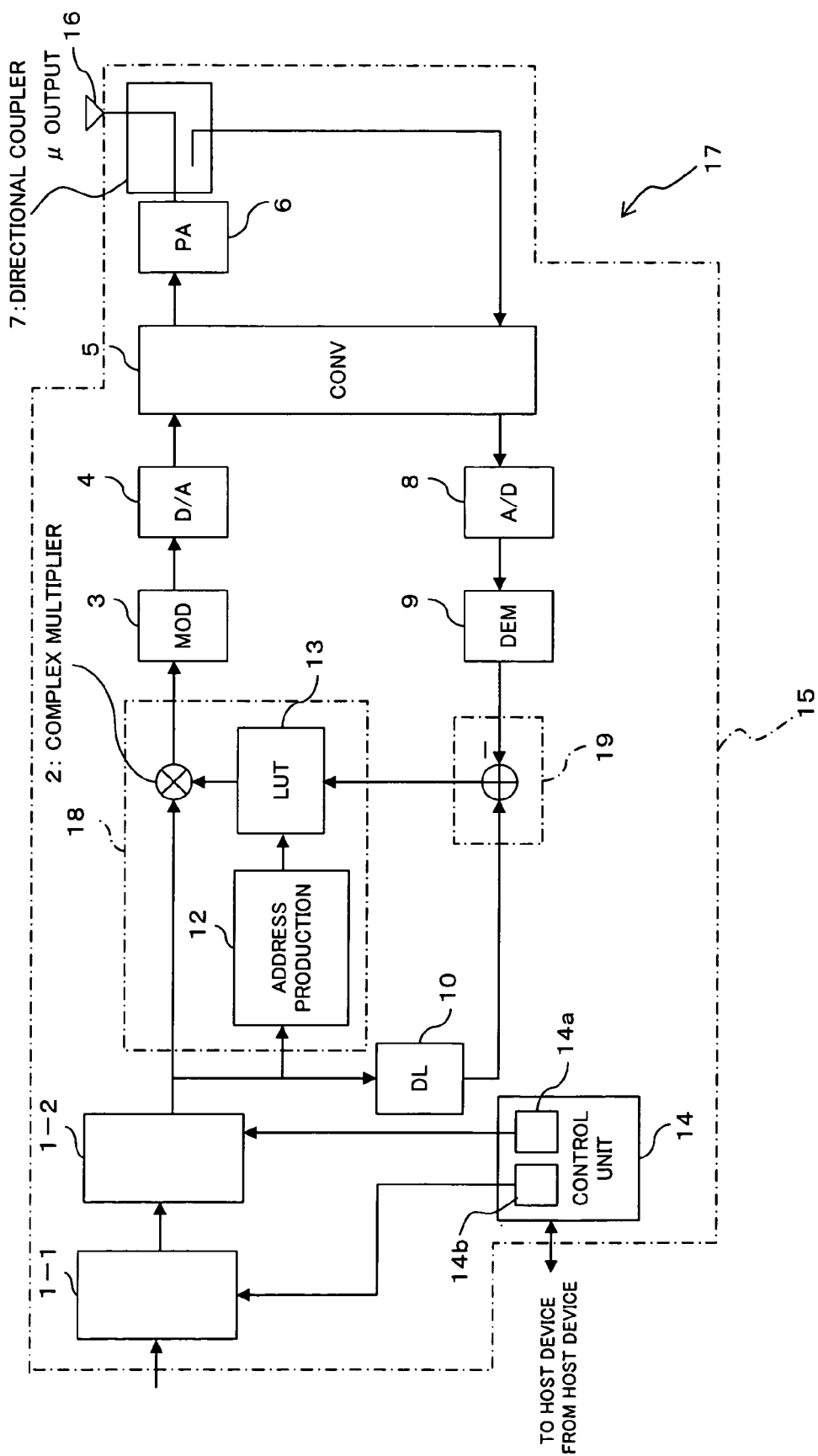
FIG. 1 is a block diagram showing a first embodiment of the present invention.

FIG. 1 is a block diagram showing a transmitting apparatus including a distortion compensation amplifying apparatus according to a first embodiment of the present invention. In FIG. 1, the distortion compensation amplifying apparatus 15 of the transmitting apparatus is for amplifying a code-division-multiplexed signal while carrying out the distortion compensation, with the signal amplified in the distortion compensation amplifying apparatus 15 being radio-transmitted through an antenna 16.

That is, the distortion compensation amplifier 15 and the antenna 16 constitutes the transmitting apparatus. This transmitting apparatus can be constructed as a transmitting unit of a base station 17 in a mobile communication network employing a CDMA communication system, and a spectrum-spread signal is transmitted to terminals existing in a covering area of this base station 17 in a state amplified by a power amplifier having a distortion compensation function. A following description will be given in a case in which the distortion compensation amplifying apparatus 15 is provided in the transmitting unit of the base station 17 in the mobile communication network employing the CDMA communication system. Incidentally, a receiving unit constituting the base station 17 is omitted from the illustration.

The distortion compensation amplifying apparatus 15 shown in FIG. 1 is made up of a baseband processing unit 1-1, a code division multiplexing unit 1-2, a complex multiplier 2, a modulator (MOD) 3, a digital/analog converter (D/A) 4, a frequency converter (CONV) 5, a power amplifier (PA) 6, a directional coupler 7, an analog/digital converter (A/D) 8, a demodulator (DEM) 9, a delay unit (DL) 10, a renewing unit 19, an address producing unit 12, a lookup table (LUT) 13 and a control unit 14.

The baseband processing unit 1-1 serially receives baseband signals to be transmitted to the terminal side and allocates channels to these plural-series baseband signals and serially outputs them along with a pseudo signal (pseudo data signal) to the code division multiplexing unit 1-2.

Figure 2:
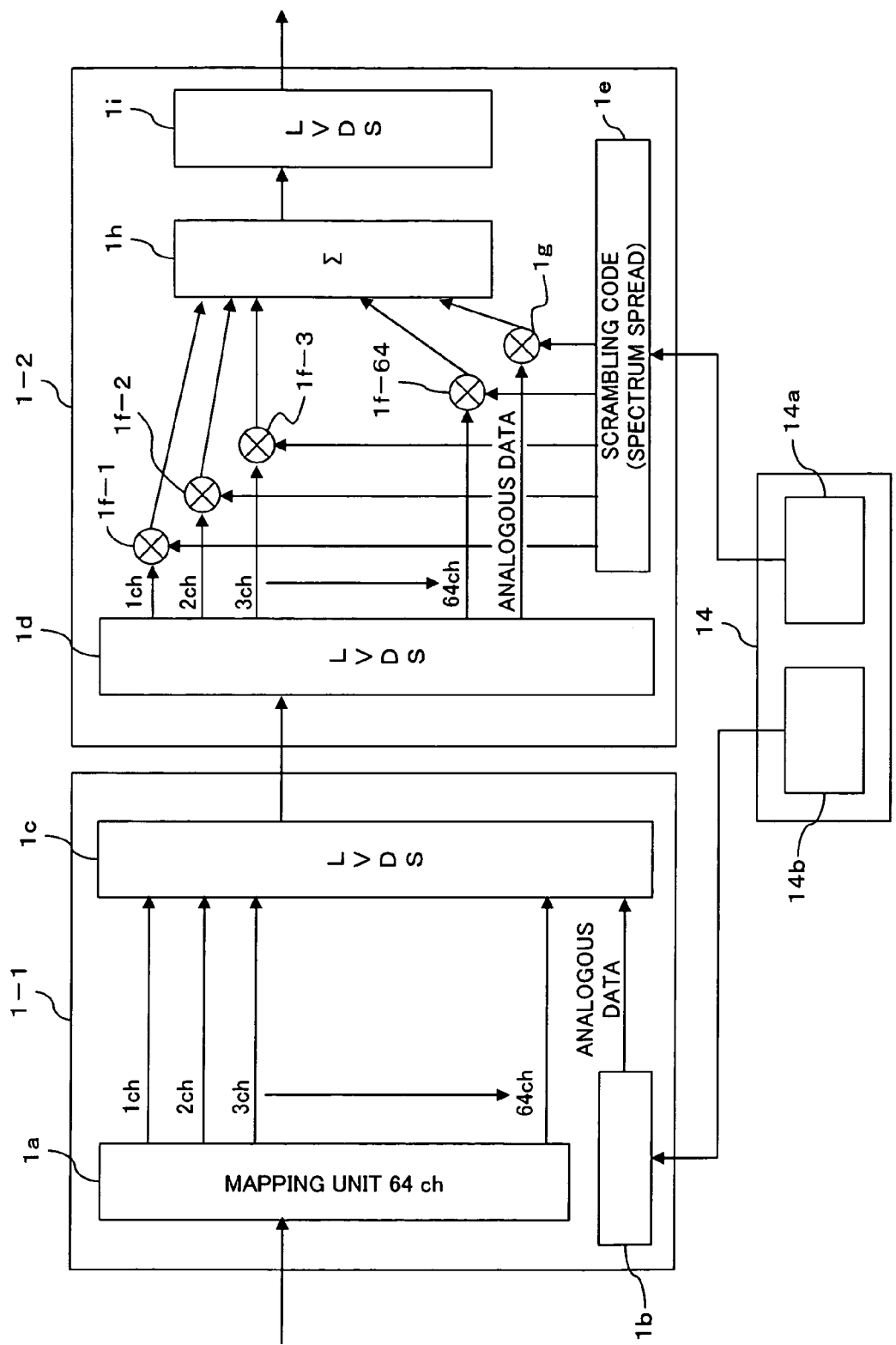
FIGS. 2 and 3 are block diagrams showing a configuration of an essential part of a distortion compensation amplifying apparatus according to the first embodiment of the present invention.

The code division multiplexing unit 1-2 receives the pseudo signal along with the base band signals, allocated to the plurality of channels, from the baseband unit 1-1 and uses scrambling codes (spread codes), different from each other, with respect to these signals (including the pseudo signal) for the code division multiplex processing. The baseband processing unit 1-1 and the code division multiplexing unit 1-2 are configured as shown in FIG. 2.

That is, the baseband processing unit 1-1 is composed of a mapping unit 1a for allocating a plurality of channels (for example, 64 channels "1ch" to "64ch" for the baseband signals serially inputted and an outputting unit 1c for outputting the baseband signals, allocated to the plurality of channels in the mapping unit 1a, along with the pseudo data signal produced in a pseudo-signal producing unit 1b.

Thus, the baseband unit 1-1 receives the plural-series baseband signals to be transmitted to the terminal side for allocating the channels to these plural-series baseband signals through the use of the mapping unit 1a and outputs the pseudo signal along with the plural-series baseband signals through the use of the outputting unit 1c.

The code division multiplexing unit 1-2 is composed of an inputting unit 1d for receiving a signal from the outputting unit 1c of the baseband processing unit 1-1, a spread code producing unit 1e for producing a spread code individually with respect to the baseband signal for each channel, multipliers 1f-1 to 1f-64 for multiplying the baseband signal for each channel by the corresponding spread code produced in the spread code producing unit 1e, a multiplier 1g for multiplying the pseudo signal by a spread code set for the pseudo signal from the spread code producing unit 1e, a sum calculating unit 1h for calculating the sum of signals which are multiplied by the spread codes in the multipliers 1f-1 to 1f-64 and 1g, and an output unit 1i for outputting the calculation result in the sum calculating unit 1h.

Therefore, the spread code producing unit 1e, the multiplier 1g and the sum calculating unit 1h in the aforesaid code division multiplexing unit 1-2 function as a pseudo-signal multiplexing unit to carry out the code division multiplex processing on a pseudo signal along with a baseband signal to each terminal.

In addition, the outputting unit 1c of the aforesaid baseband processing unit 1-1 functions as an interface to output a signal to the code division multiplexing unit 1-2, and the inputting unit 1d of the code division multiplexing unit 1-2 functions as an interface to receive a signal from the baseband processing unit 1-1, and further the outputting unit 1i thereof functions as an interface to output a signal from the code division multiplexing unit 1-2 to a latter-stage functional section (the complex multiplier 2 and the delay unit 10 shown in FIG. 1). As these outputting units 1c, 1i and the inputting unit 1d, for example, a low voltage differential signaling interface (LVDS) is applicable.

Figure 9:
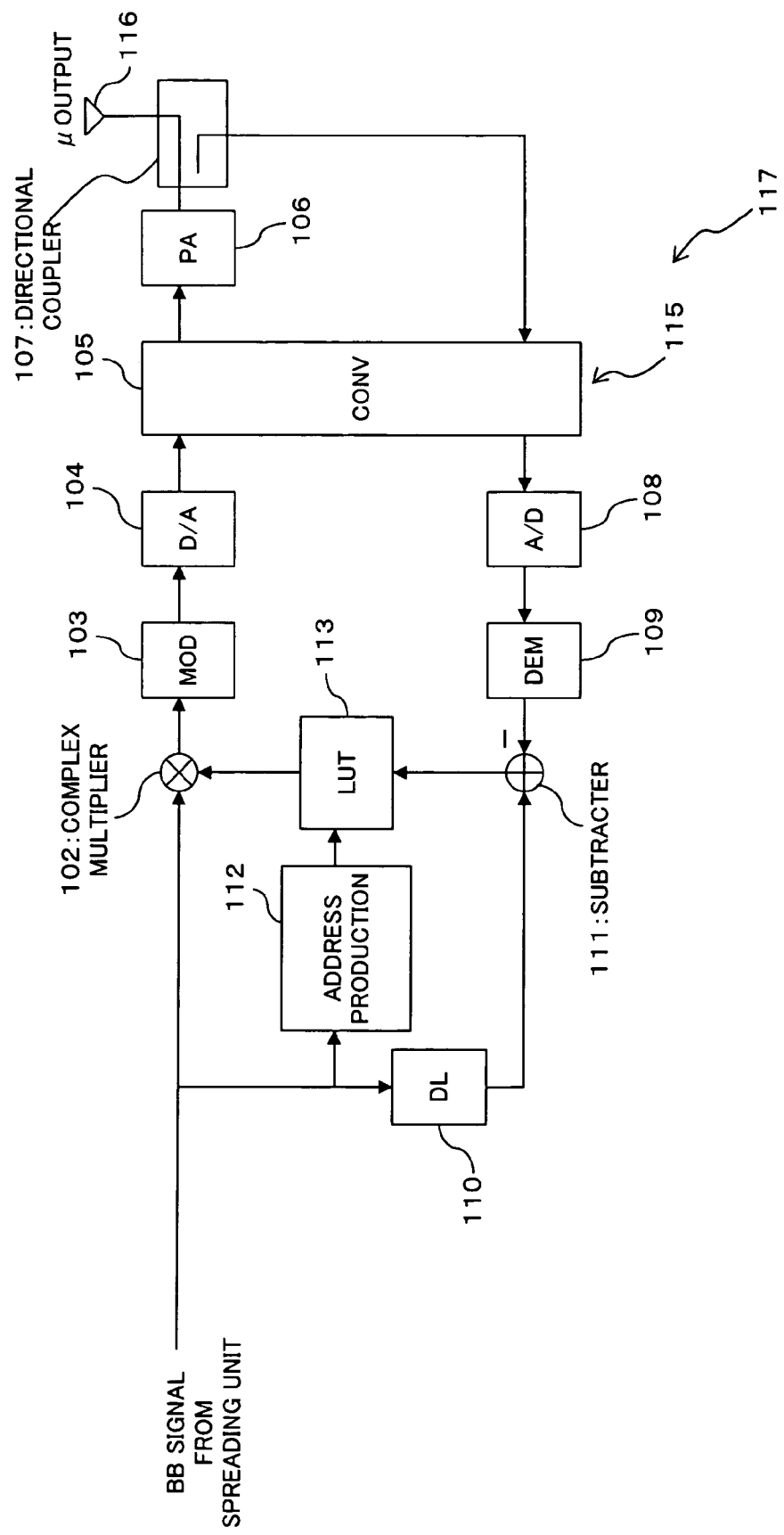
FIG. 9 is a block diagram showing a transmitting apparatus including a conventional transmission distortion amplifier.

The address producing unit 12, the LUT 13 and the complex multiplier 2 correspond to the aforesaid devices (designated at numerals 112, 113, 102) shown in FIG. 9, respectively, and these functional units organizes a distortion compensating circuit unit 18 designed to compensate for a distortion characteristic stemming from the power amplifier 6 through the use of a distortion compensation coefficient stored corresponding to a characteristic of a signal from the code division multiplexing unit 1.

Figure 3:
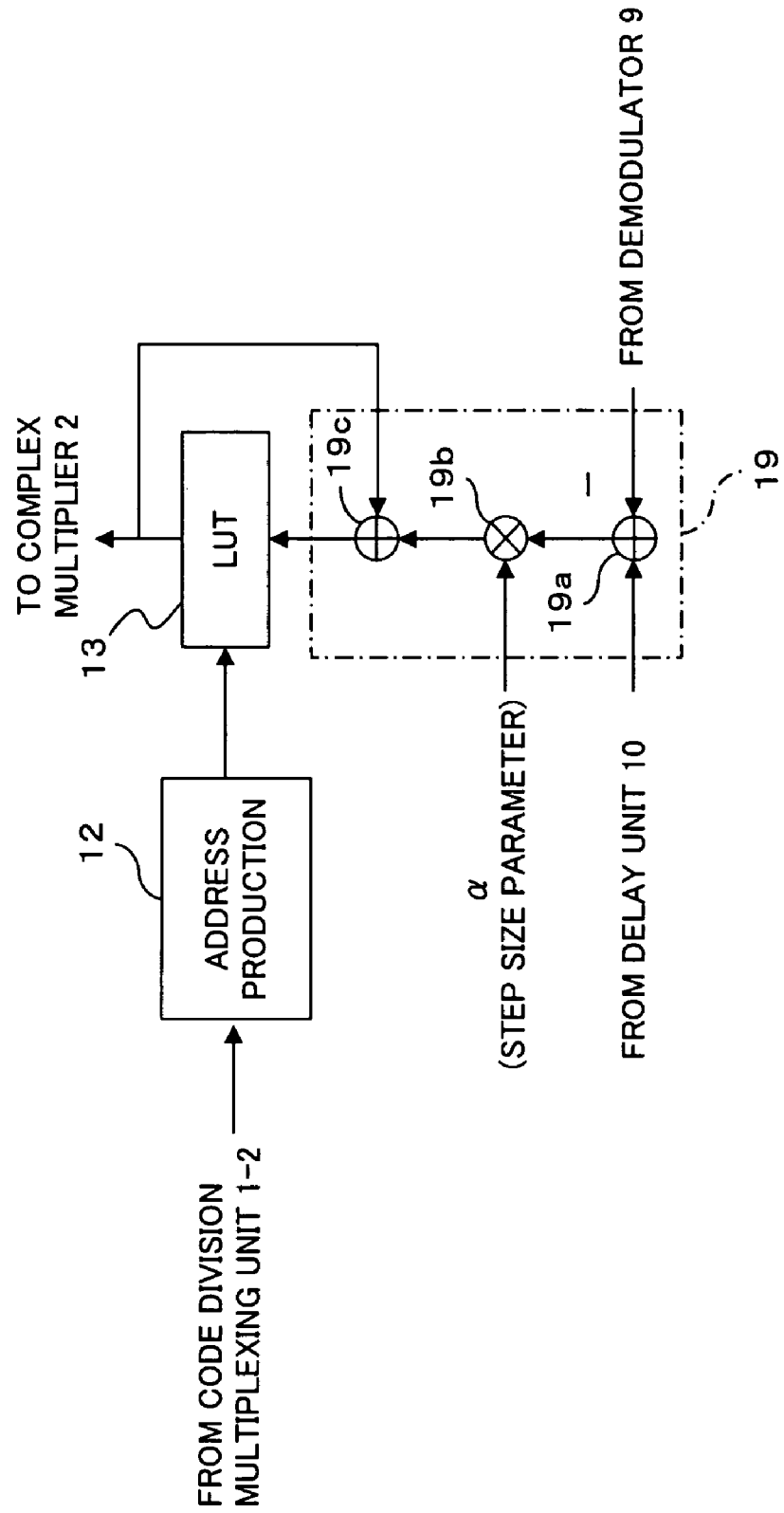

Moreover, the directional coupler 7 and the delay unit 10 correspond to the aforesaid devices (numerals 107 and 110) shown in FIG. 9, respectively. The renewing unit 19 is designed to update the distortion compensation coefficient, which is to be used for the compensation for the distortion characteristic in the distortion compensating circuit unit 18, on the basis of a result of amplification in the power amplifier 6, and it is comprised of a subtracter 19a, a parameter multiplier 19b and an adder 19c as shown in FIG. 3.

The subtracter 19a calculates a difference between a signal coming through the directional coupler 7 and a signal delayed in the delay unit 10, and the parameter multiplier 19b multiplies a result from the subtracter 19a by a step size parameter a indicative of the degree of reflection of the difference in the subtracter 19a with respect to the distortion compensation coefficient. Moreover, the adder 19c adds a multiplication result from the parameter multiplier 19b to the distortion compensation coefficient outputted from the LUT 13 to the complex multiplier 2, and the contents of the LUT 13 are renewed in a manner such that this addition result is used as a new distortion compensation coefficient. Therefore, the distortion compensation coefficient is updated in a direction of reducing the difference.

The modulator 3 is for carrying out the digital modulation on a baseband signal from the complex multiplier 2, and the digital/analog converter 4 is for converting a modulated digital signal from the modulator 3 into an analog signal, and the frequency converter 5 is for converting the frequency of the analog signal from the digital/analog converter 4 into a radio frequency such as a microwave.

In addition, the power amplifier (amplifier) 6 is for amplifying the microwave from the frequency converter 5 for the radio transmission, and it is made to amplify a signal code-division-multiplexed in the code division multiplexing unit 1. The microwave amplified in this power amplifier 6 is outputted through the directional coupler 7 to the antenna 16, and a portion thereof is outputted to the frequency converter 5. Thus, the antenna 16 can transmit the code-division-multiplexed signal to each terminal (not shown).

The pseudo signal is a signal for the renewal of the distortion compensation coefficient. For example, it can be a signal which is not transmitted to a specified destination and a signal different from a signal from a host side apparatus (for example, an RNC apparatus), which will be mentioned later, to a mobile station.

On the other hand, an amplified signal forming a portion branched by the directional coupler 7 is converted into a signal with an IF frequency in the frequency converter 5. The analog/digital converter 8 is for converting the analog IF signal from the frequency converter 5 into a digital signal, and the demodulator 9 is for carrying out the digital demodulation on the digital signal from the analog/digital converter 8. Accordingly, through the frequency converter 5, the analog/digital converter 8 and the demodulator 9, a signal similar to the baseband signal before the digital modulation is ideally obtainable with respect to the signal after the amplification in the power amplifier 6.

Thus, the renewing unit 19 performs the subtraction of the corresponding restored baseband signal from the demodulator 9 with respect to a baseband signal (reference signal) delayed in the delay unit 10 to obtain a distortion component of the power amplifier 6 so that the contents of the LUT 13 can be updated in a direction of suppressing the distortion component.

Furthermore, the control unit 14 is for controlling the code division multiplex processing on a pseudo signal in the spread code producing unit 1e, the multiplier 1g and the sum calculating unit 1h which serve as the pseudo-signal multiplexing unit of the code division multiplexing unit 1-2.

Concretely, the control unit 14 receives call information on a radio network between the base station 17 and a terminal accommodated in this base station 17 from a host unit such as RNC (Radio Network Controller) (not shown) to recognize a non-used channel on the basis of the call information and controls the spread code producing unit 1e, which constitutes the pseudo-signal multiplexing unit, to use the recognized non-used channel (spread code) for the code division multiplex processing on the pseudo signal. In this case, the RNC functions as a network control unit to generalize the control of the radio network between the base station 17 and the terminal accommodated in the base station 17. Thus, the employment of the non-used spread code enables suppressing the influence (interference and the like) on a signal addressed to another mobile station to the utmost. Incidentally, it is also feasible that one of the spread codes is reserved as a code for the pseudo signal transmission in advance and this code is used therefor.

Different from the other addressed-to-mobile-station signals, only the pseudo signal can be transmitted without being spread by the spread code. In this case, because of no spread, as an advantage, the spread processing becomes unnecessary. However, it is to be noted that the spread can suppress the interference with a signal addressed to another mobile station to the utmost.

In addition, the control unit 14 is made up of an implementation/stop control unit 14a and a power control unit 14b. The implementation/stop control unit 14a controls the implementation/stop of the code division multiplex processing on a pseudo signal in the spread code producing unit 1e, the multiplier 1g and the sum calculating unit 1h which function as the pseudo-signal multiplexing unit. The power control unit 14b controls the power on a signal code-division-multiplexed in the spread code producing unit 1e, the multiplier 1g and the sum calculating unit 1h which act as the pseudo-signal multiplexing unit.

Concretely, the implementation/stop control unit 14a carries out the implementation control for the code division multiplex processing on a pseudo signal and, when the spread code producing unit 1e allocates a pseudo signal spread code, the outputting unit 1i outputs a signal obtained by carrying out the code division multiplexing with respect to the pseudo signal along with the baseband signal.

At this time, for the implementation control, the implementation/stop control unit 14a recognizes a non-used channel on the basis of the call information received from the RNC and gives an instruction to the spread code producing unit 1e to use this non-used channel for the code division multiplex processing on the pseudo signal.

Accordingly, under the implementation control by the implementation/stop control unit 14a of the aforesaid control unit 14, the spread code whom the spread code producing unit 1e of the aforesaid code division multiplexing unit 1-2 can use for the pseudo signal corresponds to a non-used channel (not put to use) of the channels allocated for the baseband signals.

That is, the multiplier 1g serving as the pseudo-signal multiplexing unit multiplies the pseudo signal by the spread code corresponding to the non-used channel from the spread code producing unit 1e and, hence, this pseudo signal, together with the baseband signal, can be code-division-multiplexed. Thus, an inputted signal power to the power amplifier 6 becomes a high output to increase the frequency of appearance of a region, in which the power becomes high, so that a distortion compensation coefficient in a high-output region can be stored in the LUT 13 in advance.

In other words, since the aforesaid distortion compensation coefficient is renewed in the renewing unit 19 on the basis of, in the power amplifier 6, a result of amplification of a signal code-division-multiplexed in the pseudo-signal multiplexing unit, it is possible to previously store a distortion compensation coefficient corresponding to a level somewhat higher than an input level in the normal operation.

In addition, when the implementation/stop control unit 14a executes the stop control on the pseudo-signal code division multiplex processing, the outputting unit 1i outputs a signal (a pseudo signal is not multiplexed thereon) obtained by the code-division-multiplexing on a baseband signal. That is, the aforesaid spread code producing unit 1e undergoes the stop control by the implementation/stop control unit 14a of the aforesaid control unit 14 and outputs, for example, "0" for the pseudo signal to the multiplier 1g and, hence, the pseudo signal to be inputted to the inputting unit 1d is not code-division-multiplexed.

Still moreover, through the implementation control and the stop control in the aforesaid implementation/stop control unit 14a, the renewing unit 19 can update the distortion compensation coefficient on the basis of, in the power amplifier 6, a result of the amplification of a signal code-division-multiplexed in the pseudo-signal multiplexing unit so as to follow a variation of the distortion characteristic according to a using mode of the amplifier 6.

In this case, the switching between the implementation control and the stop control in the aforesaid implementation/stop control unit 14a can properly be made in accordance with the environment at the location of the base station. That is, the implementation/stop control unit 14a can execute the stop control in the normal time and can carry out the implementation control at a predetermined time interval which permits following a temperature variation causing a variation of the distortion characteristic in an off-rating region such as a high-output region. Moreover, when consideration is also given to the aged deterioration of the power amplifier 6 and the like, for example, it is also possible to shorten the period of the implementation control as the period of service of the power amplifier 6 becomes longer.

As the interval of the implementation control on the pseudo-signal code division multiplexing in the implementation/stop control unit 14a, it is also appropriate to automatically carry out the implementation control at a constant interval or at an indefinite interval by managing the time through the use of a timer or the like or by monitoring a variation of temperature or the like at the location thereof. Alternatively, it is also possible to carry out the implementation control at a timing according to an activating operation by an operator.

In particular, for example, in a case in which an event or the like (concert, fireworks display) is held in a given region, it is expectable that the radio calls concentrate on a given area and a given time zone and that the power of the baseband signal to be inputted to the power amplifier 6 in the base station 17 increases transiently. However, according to the present invention, by previously a region and time at which this event is held is inspected in advance and a time before the holding of the event is set with respect to the distortion compensation characteristic for the power amplifier 6 of the base station 17 provided in this region, and a pseudo signal is outputted at the set time and the LUT 13 is renewed in advance.

The power control unit 14b controls the power for a signal code-division-multiplexed in the spread code producing unit 1e, the multiplier 1g and the sum calculating unit 1h which serve as the pseudo-signal multiplexing unit. Concretely, it controls the power of the pseudo signal produced in the pseudo data producing unit 1b for controlling the power for a signal in which this pseudo signal is code-division-multiplexed.

Incidentally, the power of the pseudo signal to be controlled in the power control unit 14b can be set/controlled in the in-operation base station on the basis of the statistics on the transiently increasing data quantity in a time zone level or the statistics thereon in a calendar level, or it can also be set by an operator.

With the arrangement described above, in the distortion compensation amplifying apparatus 15 according to the first embodiment of the present invention, through the switching between the implementation control and the stop control on the pseudo signal code division multiplex processing in the implementation/stop control unit 14a, in the normal time in which the stop control is in execution, only the baseband signal is code-division-multiplexed in the code division multiplexing unit 1-2 and, after passing through the distortion compensating circuit unit 16, the modulator 3, the digital/analog converter 4 and the frequency converter 5, it is amplified in the power amplifier 6 and radio-transmitted through the antenna 16.

Moreover, in a case in which the implementation control is executed in the implementation/stop control unit 14a shown in FIG. 1, in addition to the baseband signal, the pseudo signal is also code-division-multiplexed, and after passing through the distortion compensating circuit unit 16, the modulator 3, the digital/analog converter 4 and the frequency converter 5, it is amplified in the power amplifier 6 and radio-transmitted through the antenna 16.

Figure 4:
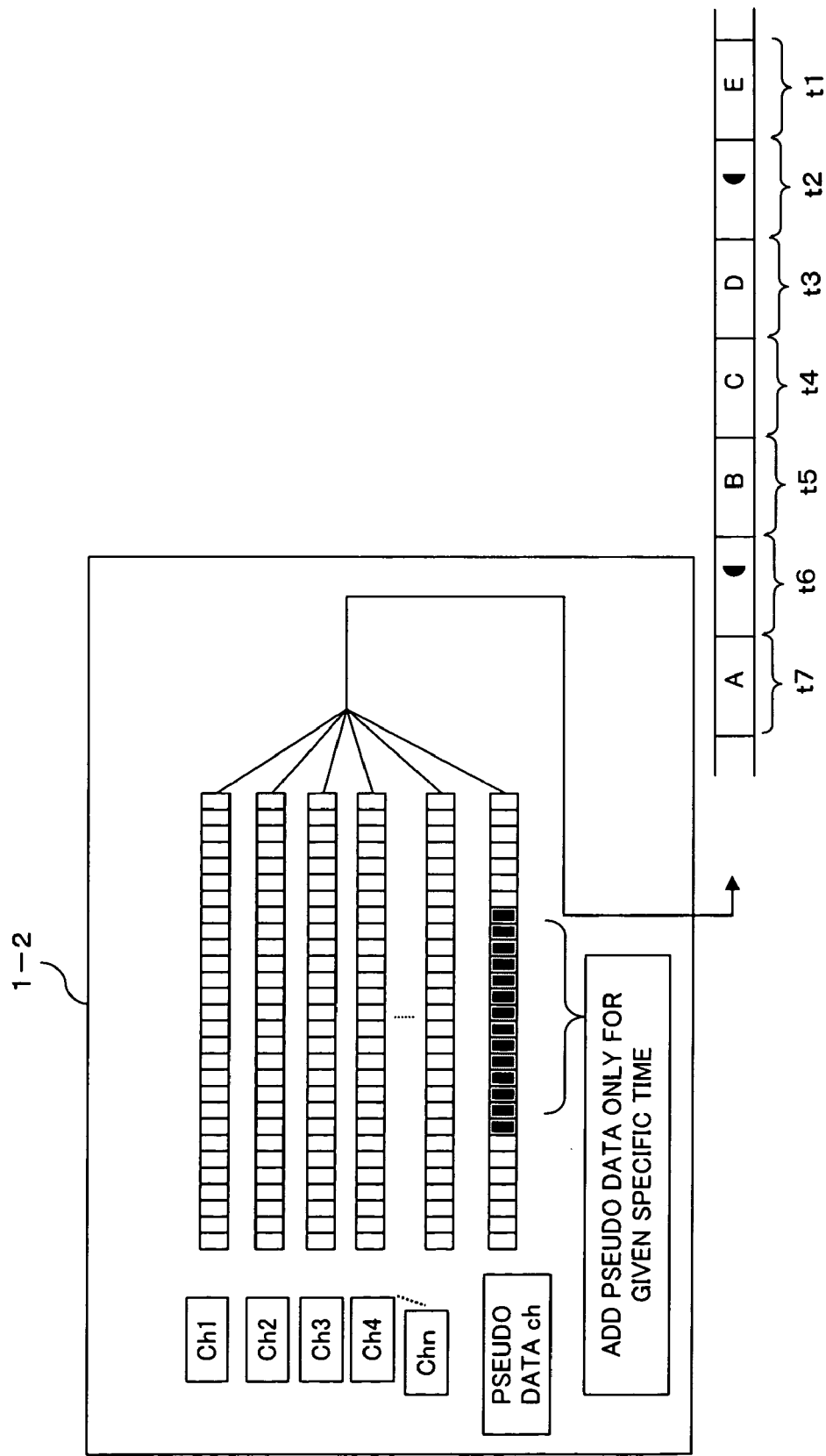
FIG. 4 is an illustration useful for explaining an operation of the distortion compensation amplifying apparatus according to the first embodiment of the present invention.

FIG. 4 is an illustration useful for explaining a signal state in a case in which, in the code division multiplexing unit 1-2 under the control of the implementation/stop control unit 14a, a pseudo signal, along with a baseband signal, is code-division-multiplexed only for a specific time period and only the baseband signal is code-division-multiplexed for a time other than the specific time period. That is, as shown in FIG. 4, the pseudo signal is also code-division-multiplexed for specific time periods t2 and t6 (time zones each having a predetermined time length), while the pseudo signal is not multiplexed for the time periods t1, t3 to t5 and t7 other than these specific time periods t2 and t6. In the illustration, each of black semicircles denotes that a pseudo signal is multiplexed in the time period t2 or t6, while "E", "D", "C", "B" and "A" represent that, for time periods t1, t3 to t5 and t7, only a baseband signal is code-division-multiplexed without multiplexing a pseudo signal and that the call setting state varies. Thus, the input signal power to the power amplifier 6 is made as a high output in a pseudo-fashion, thereby increasing the frequency of appearance of a high-power region.

Moreover, the renewing unit 19 extracts a distortion component after the power amplification of a signal in which a pseudo signal is code-division-multiplexed along with a baseband signal to obtain a distortion compensation coefficient in an off-rating region, particularly, in a high-output region, with the distortion compensation coefficient being written in the LUT 13.

Therefore, in the distortion compensating circuit unit 16 in which the distortion compensation coefficient in a high-output region is stored by the renewing unit 19, even if a high-output baseband signal is transiently inputted to the implementation/stop control unit 14*a* afterwards, since the corresponding distortion compensation coefficient is stored in the LUT 13, the prompt convergence of the distortion characteristic becomes feasible.

That is, the updating of the distortion compensation coefficient in the renewing unit 19 can be complemented on the basis of a result of amplification of a signal, undergoing the code division multiplex processing in the pseudo signal multiplexing unit, in the power amplifier 6.

Moreover, in code-division-multiplexing the pseudo signal, since the baseband signal can also be code-division-multiplexed, the distortion compensation coefficient in the LUT 13 is renewable while interchanging data without stopping the operation of the base station 17.

For example, let it be assumed that a high-output baseband signal is inputted from the code division multiplexing unit 1-2 where a pseudo signal is code-division-multiplexed. In a case in which a difference "5" between an output of the demodulator 9 and an output of the delay unit 10 is obtained as a distortion component in the subtracter 19*a* of the renewing unit 19, the parameter multiplier 19*b* multiplies a difference value from the subtracter 19*a* by "0.01" as a step size parameter α and outputs the multiplication result "0.05" to the adder 19*c*. The adder 19*c* adds the value "0.05" from the parameter multiplier 19*b* to a value "1+j0" stored in the LUT 13 to obtain "1.05" as a distortion compensation coefficient for the renewal, with the resultant distortion compensation coefficient being stored in an address area corresponding to that signal power on the LUT 13.

Through the use of the distortion compensation coefficient "1.05" renewed in this way, the distortion characteristic of the power amplifier 6 is controlled in a decreasing direction so that the output of the subtracter 19*a* of the renewing unit 19, which is a distortion component, is reducible from "5" to "3". In this case, an output value "0.03" is obtainable in the parameter multiplier 19*b*. Thus, the adder 19*c* adds the output value "0.03" from the parameter multiplier 19*b* to the renewed value "1.05" in the LUT 13 to obtain a distortion compensation coefficient "1.08" for the renewal which in turn is stored in an address area corresponding to that signal power on the LUT 13.

Through the use of the distortion compensation coefficient "1.08" renewed in this way, the distortion characteristic of the power amplifier 6 is controlled in a decreasing direction so that the output of the subtracter 19*a* of the renewing unit 19, which is a distortion component, is further reducible from "3" to "1". Following this, the distortion compensation coefficient renewing processing is conducted likewise, thus providing a distortion compensation coefficient which can achieve the convergence of the distortion characteristic originating from the baseband signal having that signal power. That is, the difference value in the subtracter 19*a* converges to (develops to) "0".

In this connection, in the control unit 14, the response time from when call information is obtained from the RNC until a control signal is outputted to carry out the code division multiplexing on a pseudo signal sufficiently meets the requirement. Moreover, although it is considered that, in the time in which the pseudo signal is also multiplexed in the code division multiplexing unit 1-2, the power rises temporarily to make the interference with a channel in which another baseband signal is multiplexed, the time needed for the renewal of the LUT 13 can be set to be, for example, below approximately several hundreds ms, it does not exert great influence on the interference with the other channels.

Figure 10:
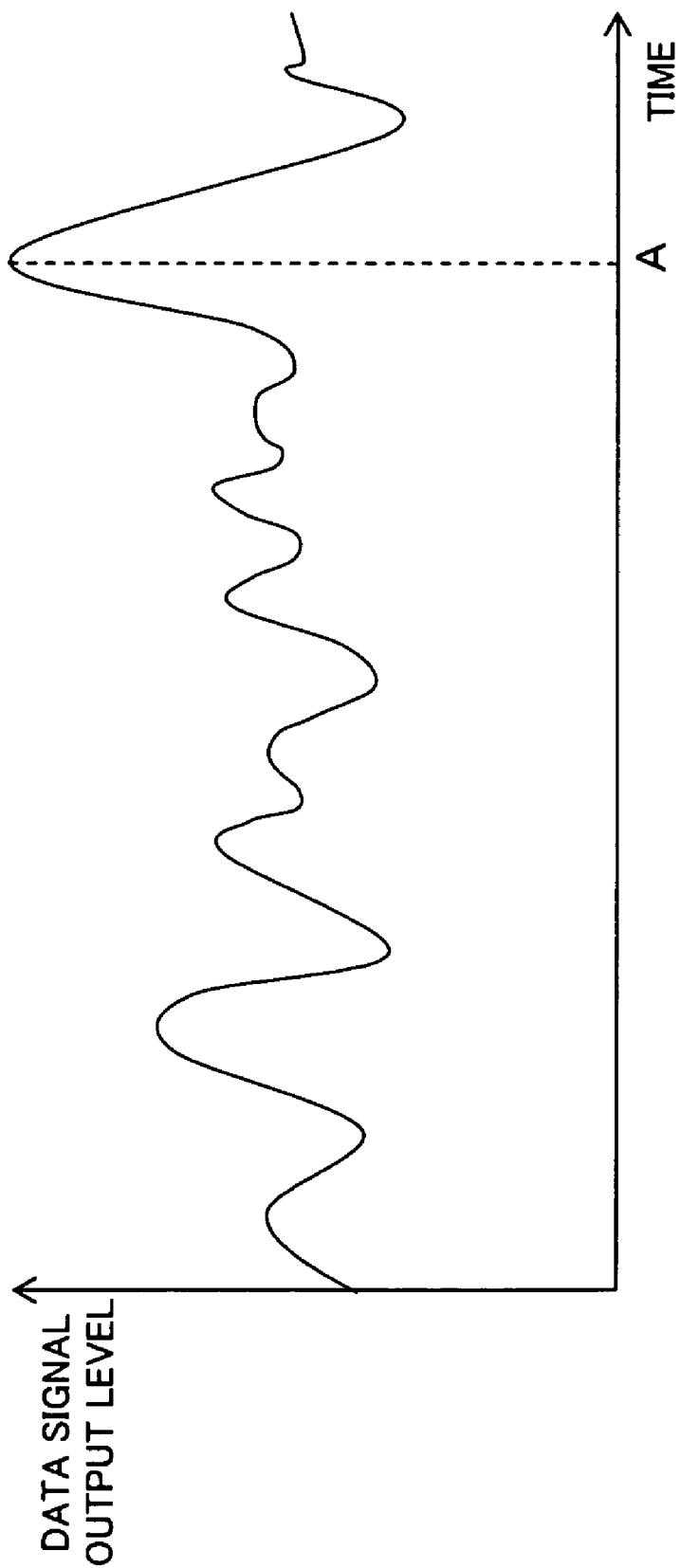
FIG. 10 is an illustration for describing problems to be solved by the embodiments of the present invention.

Therefore, since a pseudo signal, along with a baseband signal, is code-division-multiplexed by means of the implementation control in the implementation/stop control unit 14*a* as mentioned above, in the renewing unit 19, the value of a distortion compensation coefficient for the compensation for a distortion characteristic of a high power output region in the distortion compensating circuit unit 18 can previously be renewedly set at a value according to the temperature around the power amplifier 6 or the age-based deterioration of the power amplifier 6 and, hence, even in the above-mentioned case in which the signal power increases relatively rapidly at the time point A as shown in FIG. 10, the distortion compensating circuit unit 18 immediately carries out the distortion compensation.

Thus, according to the first embodiment of the present invention, since the renewal of the distortion compensation coefficient in the renewing unit 19 can be complemented on the basis of a result of the amplification of a signal in the power amplifier 6, which has been code-division-multiplexed in the pseudo-signal multiplexing unit, even if a signal with off-rating power is inputted to the power amplifier 6 because the signal power increases relatively rapidly, the distortion compensation coefficient can previously be retained in the LUT 13 of the distortion compensating unit 18 through the renewal processing in the renewing unit 19 and, hence, owing to the prompt response, the distortion compensation can be made with high accuracy.

In addition, since the pseudo signal can properly be code-division-multiplexed during the apparatus operation, through the signal power control using this pseudo signal, in an off-rating region, the renewing unit 19 can update a region involved in a temperature variation or the like at a place of the installation. Therefore, in the specification at the shipment of the apparatus from a factory, there is no need to finely store the distortion compensation coefficients, particularly, in a high-output region.

Still additionally, since the signal power range storing the distortion compensation coefficients as the rating can be narrowed down, it is possible to shorten the training time taken for setting of the values in the LUT 13 before the shipment of the apparatus.

Yet additionally, it should be noted that, as will be described hereinbelow, a distortion compensation coefficient to be newly stored can be stored by taking the storage situation in the LUT 13 into consideration.

That is, the control unit 14 monitors the storage information in the LUT 13 and specifies an input level in the LUT 13, at which a distortion compensation coefficient is not stored, for calculating a level of a pseudo signal to be added to the present level of the code division multiplexing unit 1-2. That is, the level calculation is made in terms of how much level is necessary for the result of the addition to the present output level thereof to reach the level on which no storage exists.

Moreover, the power control unit 14*b* receives the necessary pseudo signal level calculated in this way and outputs the pseudo signal with this level to the code division multiplexing unit 1-2 for adding it thereto.

This facilitates the storage of the distortion compensation coefficients missing in the LUT 13. Incidentally, in this case, for the addition of the pseudo signal, consideration is given to the fact that the input level can vary and, hence, the pseudo signal with a level which increases stepwise in units of one chip (or a plurality of chips) of a spread code is added thereto. This can cope with the variation of the input level.

Still moreover, although in the above-described first embodiment one spread code is allocated to a pseudo signal, it is also appropriate that a plurality of non-used spread codes are allocated thereto and, for example, a common pseudo is spread with a first spread code and a second spread code to be handled as pseudo signals corresponding to two channels and added thereto in the code division multiplexing unit 1-2. In this case, the pseudo signal spread with the first spread code is first added in the code division multiplexing unit 1-2 and the pseudo signal spread with the second spread code is then added therein after the elapse of a predetermined period of time (if three or more pseudo signals are added, pseudo signals spread with a third, fourth . . . spread codes are added therein afterwards). This can suppress the rapid variation of the input level stemming from the addition of the pseudo signals and can renew the insufficient portions in the LUT 13 in a stepwise fashion. In this connection, it is preferable that the control unit determines the number of spread codes for the addition in accordance with the needed level of the pseudo signal as mentioned above.

Incidentally, although in this example a distortion compensation coefficient which is not stored yet is stored therein, for example, it is also possible that a distortion compensation coefficient which has been renewed earlier is specified preferentially and a pseudo signal is produced for that level as mentioned above, and added thereto.

A decision on a new distortion compensation coefficient and an old distortion compensation coefficient can be made in a manner such that, for example, information such as renewal times is simultaneously stored in the LUT 13 at the renewal and a comparison is made between the renewal times.

That is, a level corresponding to a distortion compensation coefficient having an earlier renewal time is specified.

Naturally, it is efficient that this specification is carried out in a state limited to distortion compensation coefficients with high input levels above a predetermined level.

[B] Description of Second Embodiment

Figure 5:
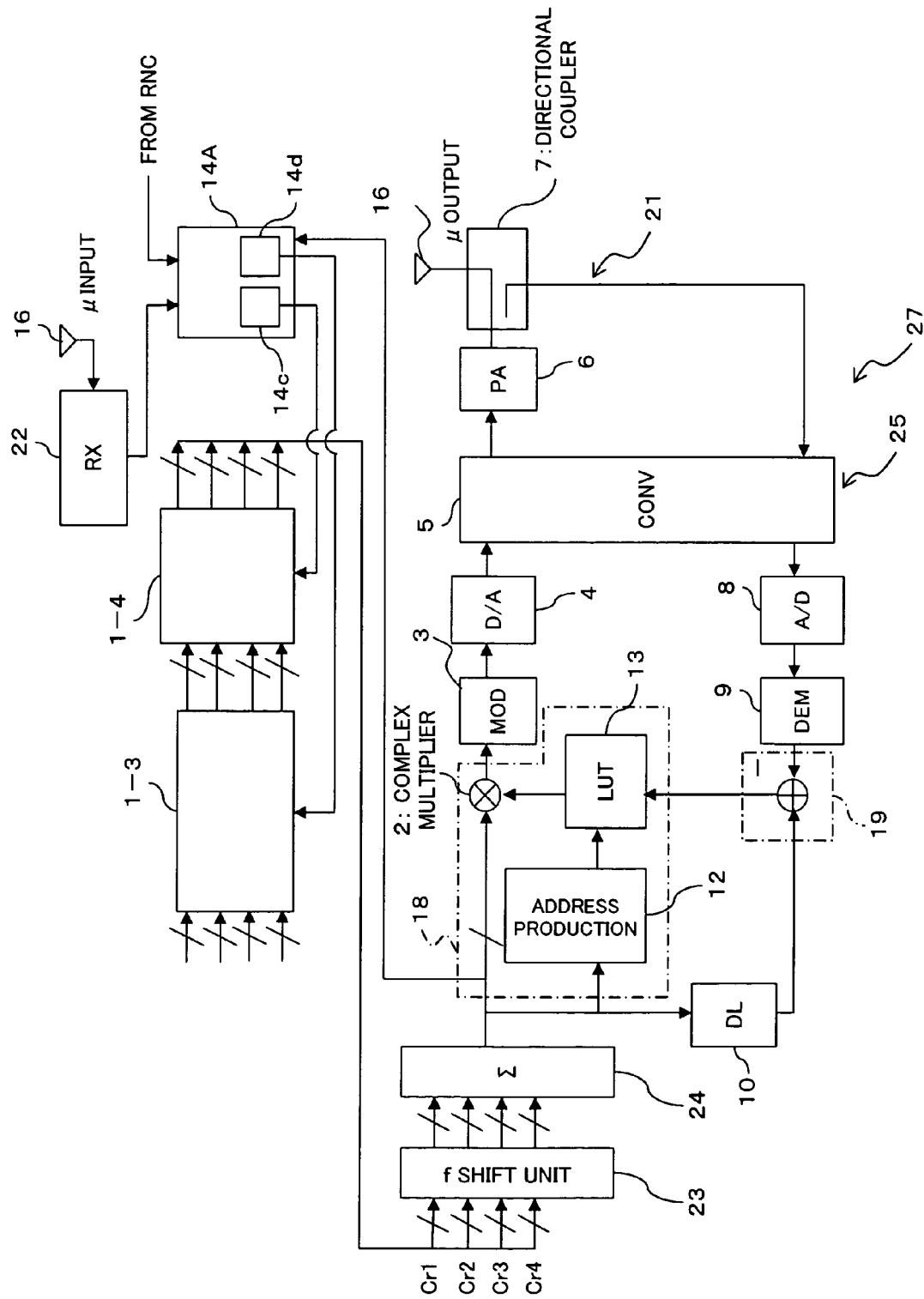
FIG. 5 is a block diagram showing a second embodiment of the present invention.

FIG. 5 is a block diagram showing a distortion compensation amplifying apparatus according to a second embodiment of the present invention. This distortion compensation amplifying apparatus 25 shown in FIG. 5 is also designed to perform the amplification while carrying out the distortion compensation with respect to a signal code-division-multiplexed. This distortion compensation amplifying apparatus 25 and an antenna 16 constitute a transmitting apparatus, and a transmitting unit 21 as this transmitting apparatus and a receiving unit 22 organize a base station 27 in a radio network.

Figure 7:
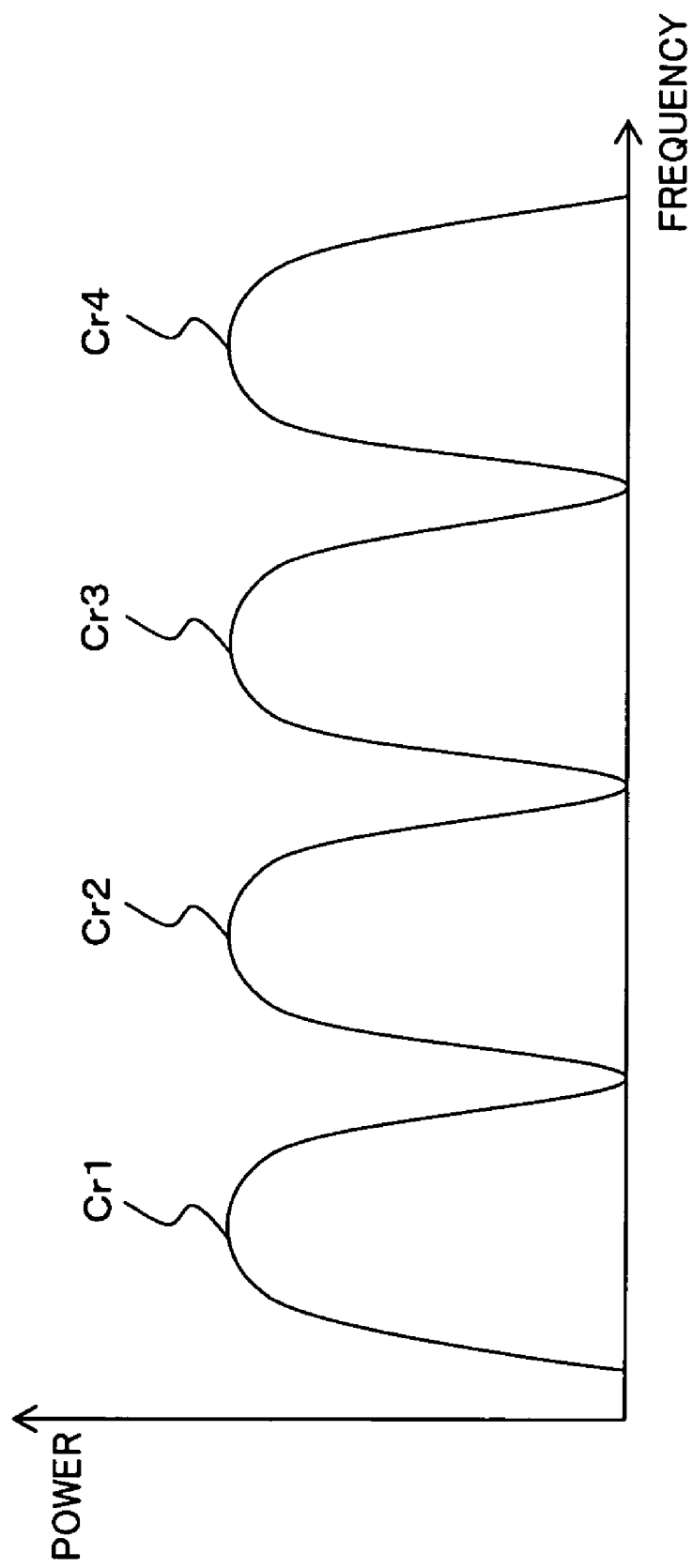
FIG. 7 is an illustration useful for explaining the transmission of a signal code-division-multiplexed through the use of multi-carrier in the second embodiment of the present invention.

As compared with the first embodiment described above, as different points, the transmitting unit employing the distortion compensation amplifying apparatus according to the second embodiment is made to transmit a signal code-division-multiplexed using multi-carrier (in this case, four carriers Cr1 to Cr4) for example, shown in FIG. 7 and the control unit 14 employs a different control mode for the implementation/stop of the code division multiplexing with respect to a pseudo signal. The other arrangements are basically the same. In FIG. 5, the reference numerals which are the same as those in FIG. 1 denote approximately analogous parts.

The distortion compensation amplifying apparatus 25 shown in FIG. 5 is made up of a baseband processing unit 1-3 for allocating channels to base band signals inputted serially in a plurality of series (in this case, four systems) and for outputting them together with pseudo signals as four-series serial signals, and a code division multiplexing unit 1-4 for carrying out the code division multiplex processing with respect to the baseband signals serving as four-series serial signals from the baseband processing unit 1-3 and for outputting them as the four-series serial signals.

Figure 6:
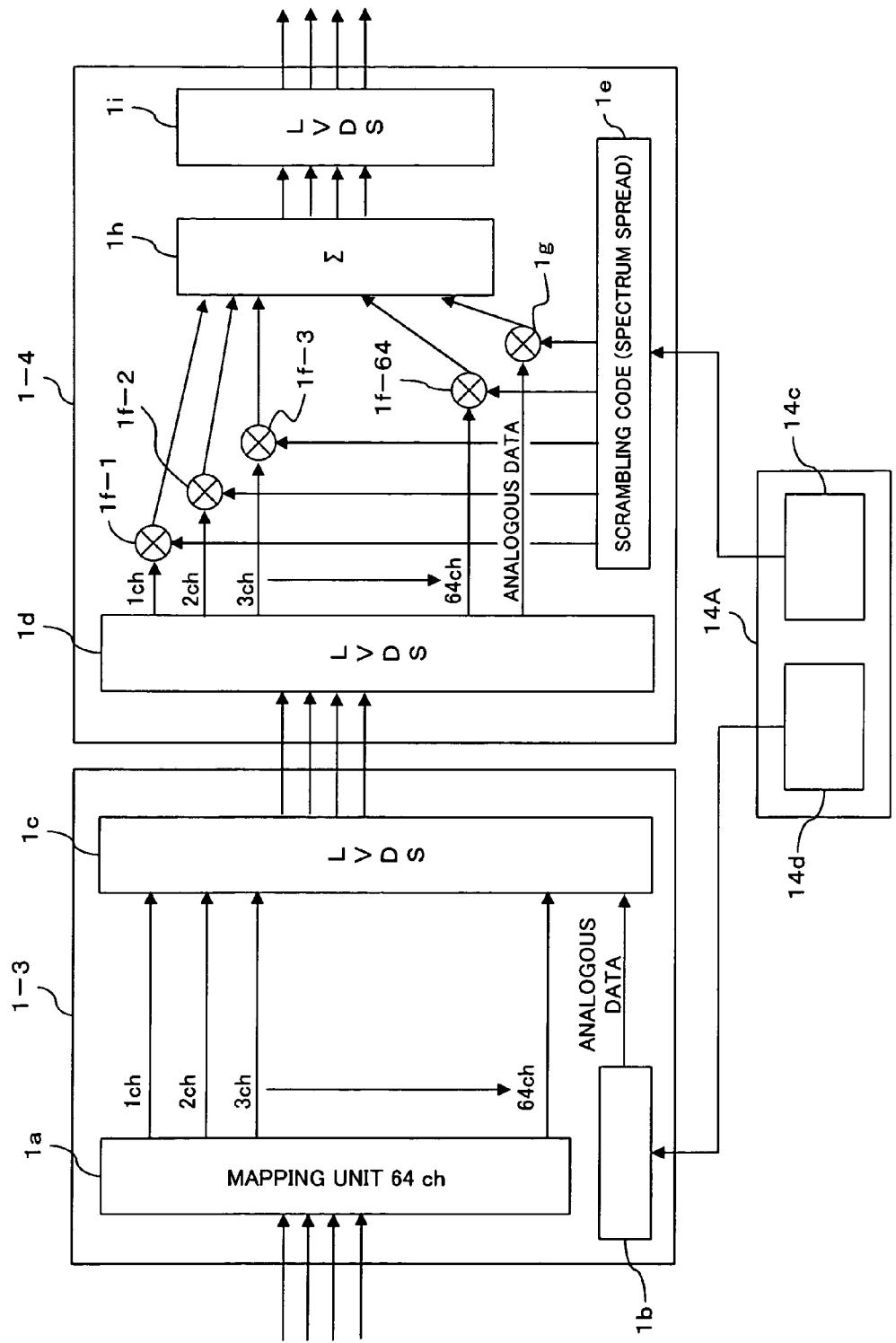
FIG. 6 is a block diagram showing a configuration of an essential part of a distortion compensation amplifying apparatus according to the second embodiment of the present invention.

The baseband processing unit 1-3 and the code division multiplexing unit 1-4 have arrangements shown in FIG. 6. That is, they are basically similar to the baseband processing unit 1-1 and the code division multiplexing unit 1-2 (see FIG. 2) according to the above-described first embodiment, except that the signals to be inputted and outputted are four-series serial signals.

In addition, In FIG. 5, reference numeral 23 designates a frequency shift unit, and this frequency shift unit 23 is for frequency-shifting the four-series signals, code-division-multiplexed in the code division multiplexing unit 1-4, to signals having frequencies of the carriers Cr1 to Cr4 corresponding to the respective series. Still additionally, reference numeral 24 represents a synthesizing unit, and this synthesizing unit 24 is for synthesizing (frequency-multiplexing) the signals with the frequencies of the carriers Cr1 to Cr4 from the frequency shift unit 23. An output of this synthesizing unit 24 is inputted to the complex multiplier 2, the address producing unit 12 and the delay unit 10 as in the case of the code division multiplexing unit 1-2 according to the above-described first embodiment.

Moreover, the distortion compensation amplifying apparatus 25 according to the second embodiment differs from the above-described first embodiment in that it includes control unit 14A for controlling the code division multiplexing processing on a pseudo signal in the pseudo-signal multiplexing unit on the basis of the information on a control channel from a terminal, which is received by the receiving unit 22, the information on the call information from the RNC and the information on the total power of signals outputted from the code division multiplexing unit 1-4 and inputted through the frequency shift unit 23 and the synthesizing unit 24 to the distortion compensating circuit unit 18.

That is, the receiving unit 22 receives a signal from a terminal, along with the control channel information, through the antenna 16 and outputs, of the received control channel information, the information [for example, APC (Automatic Power Control) information from a terminal] on the transmission power from this base station 27 to the control unit 14A.

Still moreover, on the basis of the transmission power information forming the control channel information to be received by the receiving unit 22, the control unit 14A calculates the transmission power for an individual channel signal constituting a signal to be radio-transmitted from the transmitting unit 21, and on the basis of the calculation result, controls the code division multiplex processing with respect to a pseudo signal in the pseudo-signal multiplexing unit.

Furthermore, the control unit 14A receives the call information in the radio network, such as the number of accesses of calls, from the RNC acting as a network control apparatus which generalizes the control of the radio network between this base station 27 and a terminal and, on the basis of the received call information, controls the code division multiplex processing on the pseudo signal in the pseudo-signal multiplexing unit.

Still furthermore, the control unit 14A monitors the total power of the signals outputted from the code division multiplexing unit 1-4 and inputted through the frequency shift unit 23 and the synthesizing unit 24 to the distortion compensating circuit unit 18 and, on the basis of this monitor result, controls the code division multiplex processing on the pseudo signal in the pseudo-signal multiplexing unit.

Thus, the control unit 14A can recognize a using situation of the channels allocated for the base band signals and the transmission power of the signal amplified in the amplifier 6, and on the basis of this recognition result, when the transmission power is below a threshold set in advance and a non-used channel exists, it can control the code division multiplexing unit 1-2 so that the non-used channel is allocated to a pseudo signal from the pseudo-signal producing unit.

Accordingly, the control unit 14A according to the second embodiment is equipped with an implementation/stop control unit 14*c* which is different in switching state between the implementation control and the stop control from the units (see reference numerals 14*a* and 14*b*) in the above-described first embodiment, and equipped with a power control unit 14*d*.

Therefore, on the basis of the APC control information about the individual channel from the aforesaid receiving unit 22, the total power of the baseband signals inputted to the distortion compensating circuit unit 18 and the call information from the RNC, the implementation/stop control unit 14*c* selectively switches the code division multiplex processing on a pseudo signal in the code division multiplexing unit 1-4. That is, it selects the implementation control when the transmission power is not in the vicinity of a maximum value and a free channel exists, otherwise it selects the stop control.

The APC control information is feedback information for the automatic power control on the signal power to be transmitted from this base station 27. The control unit 14A calculates the transmission power for each individual channel on the basis of the APC control information and makes a decision as to whether the control is performed to increase the transmission signal power as the transmission signal power from the base station 27 or to decrease it. At this time, at least in a case in which the control acts to increase the transmission signal power, the implementation/stop control unit 14*c* can carry out the stop control.

Moreover, in the control unit 14A, in a case in which the result of the monitor of the total power of the signals inputted to the distortion compensating circuit unit 18 shows that it rises up to a value set in the vicinity of the power (maximum power) equivalent to at least the upper limit of the transmissible data volume, the implementation/stop control unit 14*c* can carry out the stop control.

Still moreover, in the control unit 14A, when the number of accesses of calls or the like as the call information on the radio network is received from the RNC acting as a network control apparatus which generalizes the control of the radio network between the base station 27 and a terminal and the received call information shows that at least the number of circuit accesses which is the call information is larger than a predetermined reference value, the implementation/stop control unit 14*c* can carry out the stop control.

Yet moreover, in the control unit 14A, in a case in which, on the basis of the APC control information, a recognition is made as the control acts in a direction of decreasing the transmission signal power from the base station 27, when the monitor result of the total power of the signals inputted to the distortion compensating circuit unit 18 does not lie in the vicinity of the aforesaid maximum power, when the number of circuit accesses forming the call information is smaller than a predetermined reference value, or in the case of satisfying all of the conditions properly selected from the above-mentioned conditions, the implementation/stop control unit 14*c* can carry out the implementation control.

In a case in which the implementation control is executed in the implementation/stop control unit 14*c*, the power control unit 14*d* can also control the power of the signal, obtained by performing the code division multiplexing on the pseudo signal and the baseband signal, on the basis of the APC control information about the individual channel from the aforesaid receiving unit 22, the total power of the baseband signals inputted to the distortion compensating circuit unit 18 and the call information from the RNC. Also in this case, as well as the first embodiment, the signal power forming the result of the implementation of the code division multiplex processing is controlled by controlling the level of a pseudo signal produced by the pseudo-signal producing unit 1*b*.

A description will be given hereinbelow of an operation of the base station 27 employing the distortion compensation amplifying apparatus 25 thus configured according to the second embodiment of the present invention.

First of all, under the control by the implementation/stop control unit 14*c* of the control unit 14A, the transmitting unit 21 of the base station 27 is made to selectively take (switching) one of an operating mode (operating mode based on the stop control) for transmitting only the baseband signal, code-division-multiplexed and an operating mode (operating mode based the implementation control) for transmitting both the baseband signal and the pseudo signal, which have been code-division-multiplexed.

In the stop control mode by the implementation/stop control unit 14*c*, a channel is allocated to the baseband signal, to be transmitted, in the baseband processing unit 1-1 and the baseband signal is code-division-multiplexed in the code division multiplexing unit 1-2. Moreover, it is converted into signals with four carrier frequencies in the frequency shift unit 23 and the synthesizing unit 24 and then undergoes the distortion compensation through the distortion compensation coefficient multiplication in the distortion compensating circuit unit 18. Still moreover, after undergoing the processing in the modulator 3, the digital/analog converter 4 and the frequency converter 5, it is amplified by the power amplifier 6 and transmitted through the antenna 16. At this time, because of the multiplication of the distortion compensation coefficient, in the power amplifier 6, the signal amplification can be made without developing a distortion.

In addition, the implementation control mode by the implementation/stop control unit 14*c*, the pseudo signal produced in the pseudo-signal producing unit 1*b*, together with the baseband signal to be transmitted, is code-division-multiplexed in the code division multiplexing unit 1-2. Still additionally, the processing analogous to those in the case of the above-mentioned stop control mode are conducted therefor. However, in this case, since the pseudo signal is code-division-multiplexed in the code division multiplexing unit 1-2, the transmission signal power is enhanced in a pseudo fashion. Therefore, in the renewing unit 19, a distortion compensation coefficient in this high-output region can be written (renewed) in the LUT 13.

Accordingly, even in a case in which the signal power increases relatively rapidly so that a signal with an off-rating power is inputted to the power amplifier 6, a distortion compensation coefficient can previously be retained in the LUT 13 of the distortion compensating circuit unit 18 through the renewal processing in the renewing unit 19.

Figure 8:
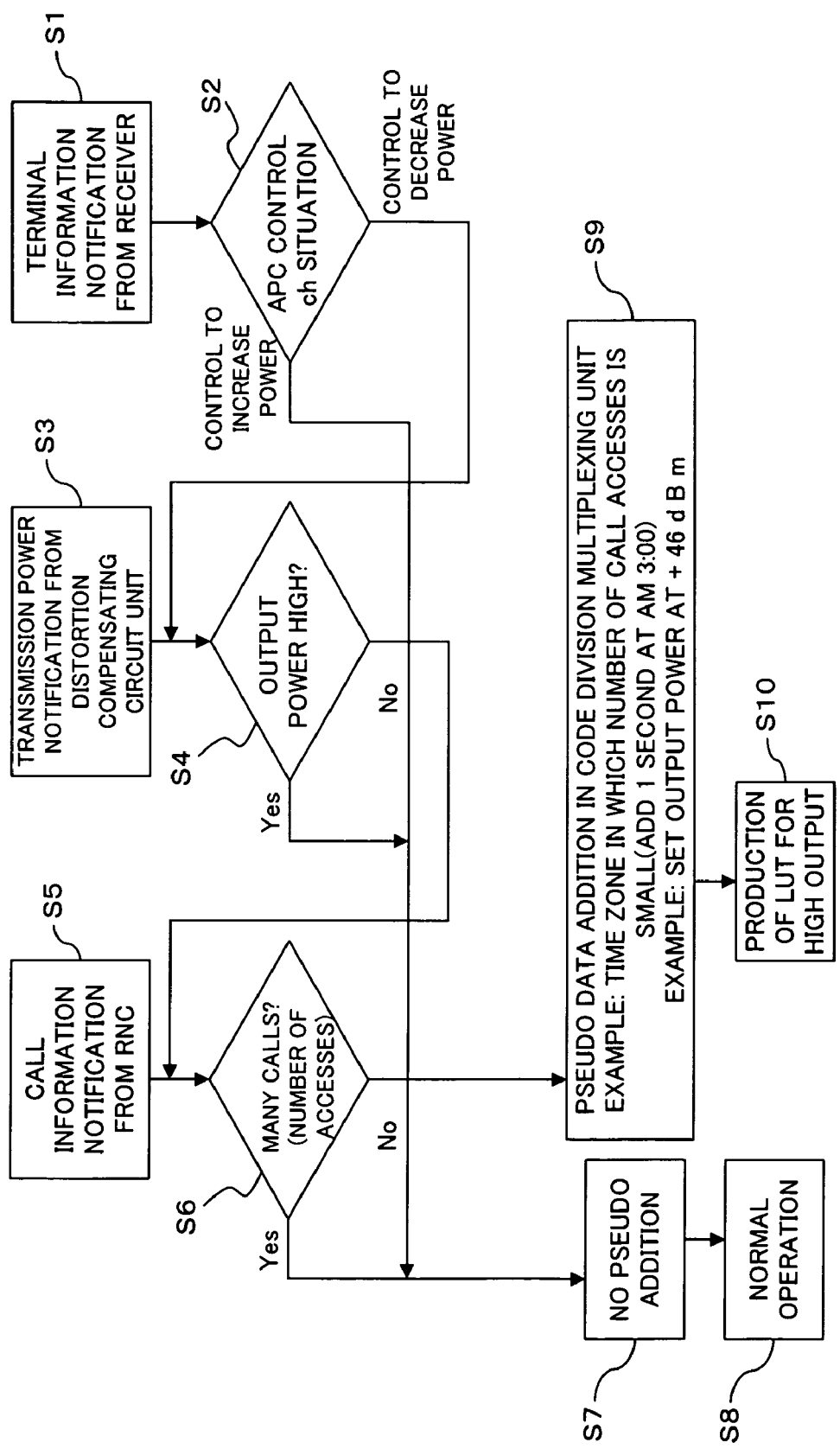
FIG. 8 is a flow chart useful for explaining an operation of the distortion compensation amplifying apparatus according to the second embodiment of the present invention.

Meanwhile, the aforesaid implementation control in the implementation/stop control unit 14*c* and the power control on a signal, obtained by the code division multiplexing of a pseudo signal, in the power control unit 14*d* for the implementation control can be executed according to, for example, a flow chart shown in FIG. 8 through the use of a combination of the control channel information from a terminal, received by the receiver 22, the call information from the RNC and the total power information of signals outputted from the code division multiplexing unit 1-4 and inputted through the frequency shift unit 23 and the synthesizing unit 24 to the distortion compensating circuit unit 18.

That is, the control unit 14A receives the APC control information on the transmission power as a notification on the terminal information from the receiving unit 22 (step S1). The control unit 14A calculates a transmission power for each individual channel on the basis of this APC control information to make a decision as to whether the control acts to increase the transmission signal power as the transmission signal power from the base station 27 or to decrease it (step S2).

At this time, in a case in which the control is executed to increase the transmission signal power, the implementation/stop control unit 14c carries out the stop control for conducting the normal operation in which only a baseband signal is code-division-multiplexed and transmitted without carrying out the code division multiplexing on a pseudo signal (through "control to increase power" route in step S2 to step S7) (step S8).

On the other hand, in a case in which the control acts to decrease the transmission signal power ("control to decrease power" route in step S2), the control unit 14A makes a decision as to whether or not the total power of the signals inputted to the distortion compensating circuit unit 18, i.e., the monitor result (step S3), has risen up to a threshold set in the vicinity of the power (maximum power) equivalent to the upper limit of the transmissible data quantity (step S4).

At this time, in a case in which the total power of the signals inputted to the distortion compensating circuit unit 18 has risen up to the threshold set in the vicinity of the maximum power, the normal operation is conducted (step S8). That is, only the baseband signal is code-division-multiplexed without conducting the code division multiplexing on the pseudo signal (through YES route in step S4 to step S7).

On the other hand, in a case in which the total power of the signals inputted to the distortion compensating circuit unit 18 has not risen up to the threshold set in the vicinity of the maximum power (NO route in step S4), the control unit 14A receives, for example, the number of call accesses or the like as the call information on the radio network from the RNC serving as a network control apparatus made to generalize the control of the radio network between this base station 27 and the terminal (step S5) to make a decision, on the basis of the received call information, as to whether or not at least the number of circuit accesses serving as the call information is larger than a predetermined reference value (step S6).

At this time, if the number of circuit accesses forming the received call information is larger than the predetermined reference value, as the normal operation, without the code division multiplexing on the pseudo signal (through YES route in step S6 to step S7), only the baseband signal is code-division-multiplexed and transmitted (step S8).

On the other hand, if the number of circuit accesses forming the received call information is not larger than the predetermined reference value, the implementation/stop control unit 14c executes the implementation control for the code division multiplex processing on a pseudo signal in the code division multiplexing unit 1-2 (through NO route in step S6 to step S9). At this time, the power control unit 14d also control the level of the pseudo signal produced in the pseudo-signal producing unit 1b, thereby enabling the control of the signal power as the result of the code division multiplex processing.

For example, when it is PM 3:00 local time in the location of this base station 27, each of the conditions in the above-mentioned steps S2, S4 and S6 is not satisfied, the code division multiplexing unit 1-2 controlled by the implementation/stop control unit 14c outputs a pseudo signal produced in the pseudo-signal producing unit 1b and code-division-multiplexed for 1 second. Thus, the contents of the LUT 13 are renewed in a situation which does not affect the actual communications, thereby getting ready for the amplification distortion stemming from a rise of rapid transmission power in the future (step S10).

At this time, the power control unit 14d executes the control to set the signal power of the pseudo signal produced in the pseudo-signal producing unit 1b so that the output power becomes +46 dBm and, hence, the renewing unit 19 extracts a distortion component in a needed high-output region to obtain a distortion compensation coefficient for the renewal as the contents of the LUT 13.

As described above, also with the second embodiment of the present invention, since the renewal of the distortion compensation coefficient in the renewing unit 19 can be complemented on the basis of the amplification result of the signal, code-division-multiplexed in the code division multiplexing unit , in the power amplifier 6, as in the case of the above-described first embodiment, even if the signal power increases relatively fast and a signal with power out of rating is inputted to the power amplifier 6, since the distortion compensation coefficient can previously be stored in the LUT 13 of the distortion compensating circuit unit 18 through the renewal processing in the renewing unit 19, a quick response becomes feasible to achieve the distortion compensation with high accuracy.

In addition, since a pseudo signal can properly be code-division-multiplexed during an operation of the apparatus, through the control of the signal power using this pseudo signal, with respect to the off-rating region, the renewing unit can update a region exposed to temperature variation or the like at the location. Therefore, as the specification of the apparatus at the shipment from a factory, there is no need to store distortion compensation coefficients in an particularly high output region, which can minimize the memory capacity of the LUT 13.

Still additionally, it is possible to narrow the signal power range in which the distortion compensation coefficients are to be stored as rating, which enables shortening a training time taken for setting the values in the LUT 13 before shipment of the apparatus.

[C] OTHERS

It should be understood that the present invention is not limited to the above-described embodiments, and that it is intended to cover all changes and modifications of the embodiments of the invention herein which do not constitute departures from the spirit and scope of the invention.

For example, although the aforesaid implementation/stop control unit 14a, 14c is made to output a control signal to the spread code producing unit 1e, the present invention is not limited to this, but it is also possible that the code division multiplexing on a pseudo signal is controlled in a different manner. Likewise, although the power control unit 14b, 14d gives a signal for the power control to the pseudo-signal producing unit 1b, the present invention is not limited to this, but it is also acceptable that the power control is executed in a different way.

Moreover, an apparatus according to the present invention can be manufactured according to the above-described embodiments.

What is claimed is:

1. A distortion compensation amplifying apparatus comprising:
   a code division multiplexing unit for carrying out code division multiplex processing with respect to a plurality of signal sequences through the use of spreading codes;
   an amplifier for amplifying a signal code-division-multiplexed in said code division multiplexing unit;
   a distortion compensating unit for compensating for a distortion characteristic caused by said amplifier through the use of a distortion compensation coefficient stored; and
   a renewing unit for renewing said distortion compensation coefficient to be used for the compensation for said distortion characteristic in said distortion compensating unit on the basis of a result of amplification in said amplifier,
   wherein said code division multiplexing unit includes a unit that outputs a pseudo-signal to be spread by a spreading code as one of the plurality of signal sequences.

2. The distortion compensation amplifying apparatus according to claim 1, further comprising a pseudo-signal producing unit for producing said pseudo signal so that said code division multiplexing unit carries out said code division multiplex processing with respect to said pseudo signal from said pseudo-signal producing unit along with said signal sequences through the use of said spreading code corresponding to a non-used channel for said signal sequences.

3. The distortion compensation amplifying apparatus according to claim 1, wherein said renewing unit renews said distortion compensation coefficient on the basis of a result of amplification in said amplifier with respect to a signal code-division-multiplexed in said code division multiplexing unit to follow a variation of the distortion characteristic according to a using mode of said amplifier.

4. The distortion compensation amplifying apparatus according to claim 1, further comprising a control unit for controlling the code division multiplex processing on said pseudo signal in said code division multiplexing unit.

5. The distortion compensation amplifying apparatus according to claim 4, wherein said control unit includes an implementation/stop control unit for controlling an implementation/stop of the code division multiplex processing on said pseudo signal in said code division multiplexing unit.

6. The distortion compensation amplifying apparatus according to claim 4, wherein said control unit includes a power control unit for controlling a power of the signal code-division-multiplexed in said code division multiplexing unit.

7. The distortion compensation amplifying apparatus according to claim 4, wherein said control unit includes a recognizing unit for recognizing a using situation of a channel for said signal sequences and a transmission power of a signal amplified in said amplifier, and said control unit is configured in a manner that controls said code division multiplexing unit on the basis of a result of recognition in the recognizing unit, when the transmission power is below a threshold set in advance and a non-used channel exists so that said non-used channel is allocated to the pseudo signal.

8. A base station comprising:
   a transmitting unit for radio-transmitting a signal code-division-multiplexed to a terminal side; and
   a receiving unit for receiving a signal from a terminal,
   wherein said transmitting unit includes:
   a code division multiplexing unit for carrying out the code division multiplex processing with respect to a plurality of signal sequences through the use of spreading codes;
   an amplifier for amplifying a signal code-division-multiplexed in said code division multiplexing unit;
   a radio transmitting unit for radio-transmitting a signal amplified in said amplifier;
   a distortion compensating unit for compensating for a distortion characteristic caused by said amplifier through the use of a distortion compensation coefficient stored; and
   a renewing unit for renewing said distortion compensation coefficient to be used for the compensation for said distortion characteristic in said distortion compensating unit on the basis of a result of amplification in said amplifier,
   wherein said code division multiplexing unit includes a unit which outputs a pseudo-signal to be spread by a spreading code as one of the plurality of signal sequences.

9. The base station according to claim 8, further comprising a pseudo-signal producing unit for producing said pseudo signal so that said code division multiplexing unit carries out the code division multiplex processing with respect to said pseudo signal from said pseudo-signal producing unit along with said signal sequences through the use of said spreading code corresponding to a non-used channel for said signal sequences.

10. The base station according to claim 8, wherein said renewing unit renews said distortion compensation coefficient on the basis of a result of amplification in said amplifier with respect to a signal code-division-multiplexed in said code division multiplexing unit to follow a variation of a distortion characteristic according to a using mode of said amplifier.

11. The base station according to claim 8, wherein said transmitting unit includes a control unit for controlling the code division multiplex processing on said pseudo signal in said code division multiplexing unit.

12. The base station according to claim 11, wherein said receiving unit is made to receive a signal from the terminal along with control channel information, and said control unit is made to calculate, on the basis of said control channel information received by said receiving unit, transmission power to be applied to a signal in an individual channel constituting a signal radio-transmitted from said transmitting unit and further to control, on the basis of a result of the calculation, the code division multiplex processing on said pseudo signal in said code division multiplexing unit.

13. The base station according to claim 11, wherein said control unit receives call information on a radio network from a network control unit made to generalize the control of said radio network between said base station and a terminal and controls, on the basis of the received call information, the code division multiplex processing on said pseudo signal in said code division multiplexing unit.

14. The base station according to claim 11, wherein said control unit monitors total power of a signal from said code division multiplexing unit and controls, on the basis of a result of the monitor, the code division multiplex processing on said pseudo signal in said code division multiplexing unit.

15. The base station according to claim 11, wherein said control unit includes an implementation/stop control unit for controlling an implementation/stop of the code division multiplex processing on said pseudo signal in said code division multiplexing unit.

16. The base station according to claim 11, wherein said control unit includes a power control unit for controlling a power of the signal code-division-multiplexed in said code division multiplexing unit.

17. The base station according to claim 11, wherein said control unit includes a recognizing unit for recognizing a using situation of channels for said signal sequences and a transmission power of a signal amplified in said amplifier, and said control unit is configured in a manner that controls the code division multiplexing unit on the basis of a result of recognition in said recognizing unit when said transmission power is below a threshold set in advance and a non-used channel exists so that said non-used channel is allocated to the pseudo signal.

18. A base station for use in a mobile communication system which employs a code division multiplex access method, said base station comprising:

an amplifier for amplifying a transmission signal addressed to a mobile station;

a storing unit for storing a distortion correction value corresponding to a level of said transmission signal; and a pre-distortion compensation amplifying apparatus for acquiring said distortion correction value corresponding to said level of said transmission signal from said storing unit to carry out pre-distortion compensation processing on said transmission signal on the basis of said distortion correction value for suppressing a distortion stemming from said amplifier, with said pre-distortion compensation amplifying apparatus including storage control means for putting said distortion correction value in said storing unit according to a distortion of a transmission signal after the amplification and a pseudo-signal adding means for adding a pseudo signal to said transmission signal to said mobile station before the amplification.

19. The base station according to claim 18, wherein said pseudo signal is not spread-processed with a spread code for separation from a transmission signal to another mobile station.

20. The base station according to claim 18, wherein said pseudo signal is added to said transmission signal to said mobile station after spread-processed through the use of one, or two or more, spread codes.

21. The base station according to claim 18, further comprising control means for controlling a level of said pseudo signal in accordance with a storing situation in said storing unit.

22. The base station according to claim 18, further comprising control means for increasing a level of said pseudo signal in a stepwise fashion.

23. The base station according to claim 18, wherein said pseudo signal is produced independently of a signal received as a transmission signal from a host device of said base station to said mobile station.

24. A pre-distortion compensation amplifying apparatus including an amplifier, said pre-distortion compensation amplifying apparatus comprising:

a signal multiplexing unit multiplexing a plurality of signal sequences;

a unit inputting a pseudo-signal to be spread by a spreading code into the signal multiplexing unit as one of the plurality of signal sequences;

a distortion compensating unit compensating for a distortion caused by the amplifier based on a distortion compensation coefficient stored in a storing unit; and a renewing unit renewing the distortion compensation coefficient based on an output of the amplifier that amplifies a multiplexed signal obtained by the signal multiplexing unit.

25. A pre-distortion compensation amplifying apparatus including an amplifier, said pre-distortion compensation amplifying apparatus comprising:

a signal multiplexing unit multiplexing a plurality of signal sequences;

a unit inputting a pseudo-signal for providing to the amplifier into the signal multiplexing unit as one of the plurality of signal sequences;

a distortion compensating unit compensating for distortion caused by the amplifier based on a distortion compensation coefficient stored in a storing unit; and a renewing unit renewing the distortion compensation coefficient based on an output of the amplifier that amplifies a multiplexed signal, including the pseudo-signal, obtained by the signal multiplexing unit.

* * * * *